(12) United States Patent
Miura et al.

(10) Patent No.: US 10,700,662 B2
(45) Date of Patent: Jun. 30, 2020

(54) ACOUSTIC WAVE DEVICE, FILTER, AND MULTIPLEXER

(71) Applicant: TAIYO YUDEN CO., LTD., Tokyo (JP)

(72) Inventors: Shinpei Miura, Tokyo (JP); Satoshi Imasu, Tokyo (JP); Takashi Matsuda, Tokyo (JP); Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 52 days.

(21) Appl. No.: 16/198,284

(22) Filed: Nov. 21, 2018

(65) Prior Publication Data

US 2019/0207583 A1    Jul. 4, 2019

(30) Foreign Application Priority Data

Dec. 28, 2017  (JP) ................................ 2017-254638
Dec. 28, 2017  (JP) ................................ 2017-254660
Sep. 6, 2018   (JP) ................................ 2018-166922

(51) Int. Cl.
  *H03H 9/145*  (2006.01)
  *H03H 3/08*   (2006.01)
  (Continued)

(52) U.S. Cl.
  CPC .......... *H03H 9/14541* (2013.01); *H03H 3/08* (2013.01); *H03H 9/02559* (2013.01);
  (Continued)

(58) Field of Classification Search
  CPC .. H03H 9/14541; H03H 3/08; H03H 9/02559; H03H 9/02637; H03H 9/02866;
  (Continued)

(56) References Cited

U.S. PATENT DOCUMENTS 6,369,491 B1   4/2002  Nakagawa et al. ............ 310/364
6,826,815 B2  12/2004  Nakagawa et al. .......... 29/25.35
  (Continued)

FOREIGN PATENT DOCUMENTS

JP        5-226337 A     9/1993
JP     2005-253034 A     9/2005
  (Continued)

OTHER PUBLICATIONS

Japanese Office Action dated Sep. 13, 2019, issued to Japanese Application No. 2017-254660.
  (Continued)

*Primary Examiner* — Benny T Lee
*Assistant Examiner* — Hafizur Rahman
(74) *Attorney, Agent, or Firm* — Stein IP, LLC

(57) ABSTRACT

An acoustic wave device includes: a piezoelectric substrate; and a pair of comb-shaped electrodes that is located on the piezoelectric substrate, includes a metal film, and excites a surface acoustic wave, the metal film being mainly composed of a metal having a melting point equal to or higher than a melting point of Pt, the metal film having a first region in which a crystal grain has a columnar shape and a second region that is located on and/or under the first region in a stacking direction and has less crystallinity than the first region or has an amorphous structure.

13 Claims, 30 Drawing Sheets

(51) Int. Cl.
*H03H 9/02* (2006.01)
*H03H 9/25* (2006.01)
*H03H 9/64* (2006.01)
*H03H 9/72* (2006.01)
*H01L 41/047* (2006.01)

(52) U.S. Cl.
CPC .... *H03H 9/02637* (2013.01); *H03H 9/02866* (2013.01); *H03H 9/02897* (2013.01); *H03H 9/02929* (2013.01); *H03H 9/25* (2013.01); *H03H 9/6436* (2013.01); *H03H 9/6483* (2013.01); *H03H 9/725* (2013.01); *H01L 41/0477* (2013.01); *H03H 9/02826* (2013.01); *H03H 9/02834* (2013.01); *H03H 9/6489* (2013.01)

(58) Field of Classification Search
CPC .. H03H 9/02897; H03H 9/02929; H03H 9/25; H03H 9/6436; H03H 9/6483; H03H 9/725; H03H 9/02826; H03H 9/02834; H03H 9/6489; H03H 9/145; H03H 9/64; H03H 9/72; H01L 41/0477
USPC ........................................................ 333/133
See application file for complete search history.

(56) References Cited

U.S. PATENT DOCUMENTS

| | | |
|---|---|---|
| 7,795,788 B2 | 9/2010 | Yokota et al. ................ 310/364 |
| 2005/0174012 A1 | 8/2005 | Ozaki et al. .............. 310/313 B |
| 2009/0243430 A1 | 10/2009 | Yokota et al. ................ 310/313 |
| 2013/0285768 A1 | 10/2013 | Watanabe et al. ............ 333/193 |
| 2016/0211829 A1 | 7/2016 | Iwaki et al. |

FOREIGN PATENT DOCUMENTS

| | | |
|---|---|---|
| JP | 2007-13815 A | 1/2007 |
| JP | 2013-81068 A | 5/2013 |
| JP | 2015-73331 A | 4/2015 |
| JP | 2016-136712 A | 7/2016 |
| WO | WO 2006/046545 A1 | 5/2006 |

OTHER PUBLICATIONS

Notice of Reasons for Refusal dated May 28, 2019, issued by the Japanese Patent Office in corresponding application JP 2017-254660.

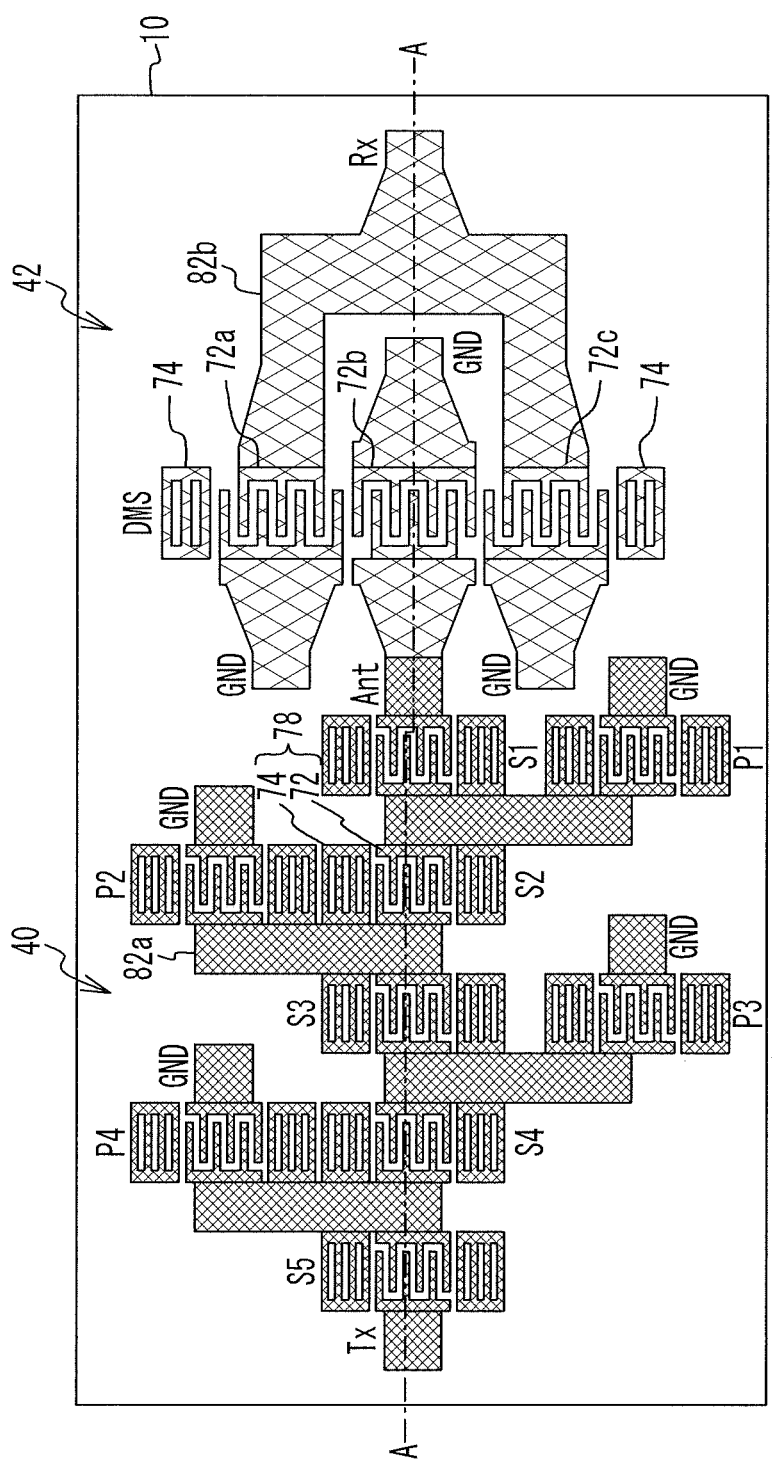
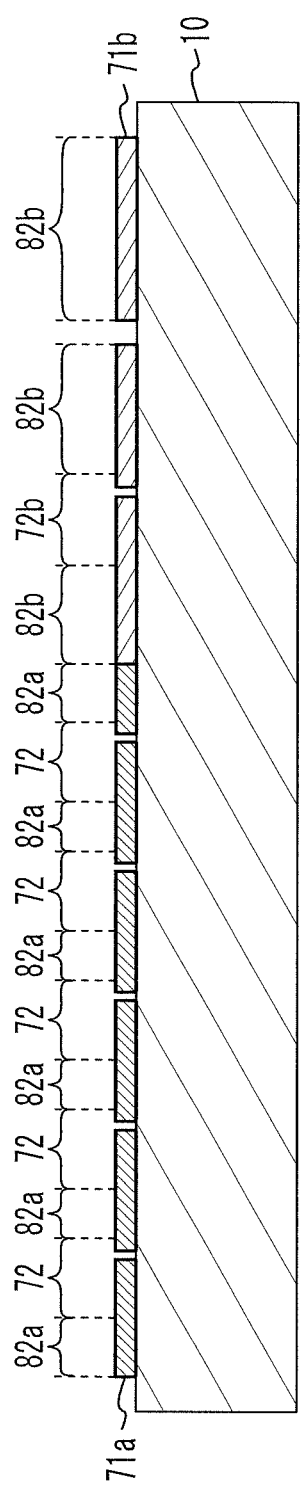
FIG. 18A
FIG. 18B

ACOUSTIC WAVE DEVICE, FILTER, AND MULTIPLEXER

CROSS-REFERENCE TO RELATED APPLICATION

This application is based upon and claims the benefits of priorities of the prior Japanese Patent Application No. 2017-254660, filed on Dec. 28, 2017, the prior Japanese Patent Application No. 2017-254638, filed on Dec. 28, 2017, and the prior Japanese Patent Application No. 2018-166922, filed on Sep. 6, 2018, the entire contents of which are incorporated herein by reference.

FIELD

A certain aspect of the present invention relates to an acoustic wave device, a filter, and a multiplexer.

BACKGROUND

In high frequency communication systems typified by mobile phones, high-frequency filters have been used to remove unnecessary signals other than signals in the frequency band used for communication. The high-frequency filter includes an acoustic wave device having a surface acoustic wave (SAW) element or the like. The SAW element is an element in which an Interdigital Transducer (IDT) having a pair of comb-shaped electrodes is formed on a piezoelectric substrate. It has been known that the loss is reduced by making the acoustic velocity of the surface acoustic wave excited by the IDT lower than the acoustic velocity of a bulk wave propagating through the piezoelectric substrate, as disclosed in, for example, Japanese Patent Application Publication No. 2016-136712 (hereinafter, referred to as Patent Document 1).

It has been known that when the IDT is formed of an Al film, an amorphous Al underlayer or an Al underlayer having a fine-grained structure is formed and then an Al film is formed on the underlayer, as disclosed in, for example, Japanese Patent Application Publication No. H05-226337 (hereinafter, referred to as Patent Document 2). It has been known to use a Pt film, a Mo film, or a W film as the IDT, as disclosed in, for example, Japanese Patent Application Publication No. 2015-73331 (hereinafter, referred to as Patent Document 3).

SUMMARY OF THE INVENTION

According to a first aspect of the present invention, there is provided an acoustic wave device including: a piezoelectric substrate; and a pair of comb-shaped electrodes that is located on the piezoelectric substrate, includes a metal film, and excites a surface acoustic wave, the metal film being mainly composed of a metal having a melting point equal to or higher than a melting point of Pt, the metal film having a first region in which a crystal grain has a columnar shape and a second region that is located on and/or under the first region in a stacking direction and has less crystallinity than the first region or has an amorphous structure.

According to a second aspect of the present invention, there is provided a filter including the above acoustic wave device.

According to a third aspect of the present invention, there is provided a multiplexer including the above filter.

BRIEF DESCRIPTION OF THE DRAWINGS

FIG. 18A is a plan view of a transmit filter and a receive filter in accordance with a second variation of the fourth embodiment, and FIG. 18B is a cross-sectional view taken along line A-A in FIG. 18A;

DETAILED DESCRIPTION

When a metal having a high density is used for the comb-shaped electrode to slow the acoustic velocity of the surface acoustic wave as disclosed in Patent Document 1, the application of high-frequency signals with a large electric power to the comb-shaped electrodes may break the IDT.

Hereinafter, with reference to the accompanying drawings, embodiments of the present disclosure will be described.

First Embodiment

Figure 1A:
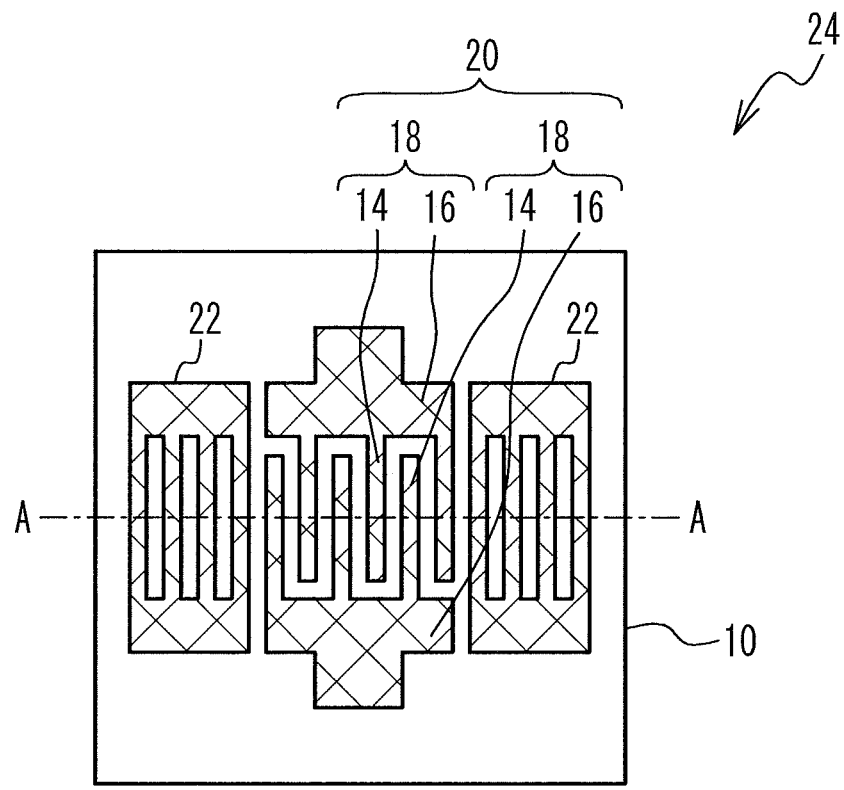
FIG. 1A is a plan view of an acoustic wave resonator in a first embodiment.
Figure 1B:
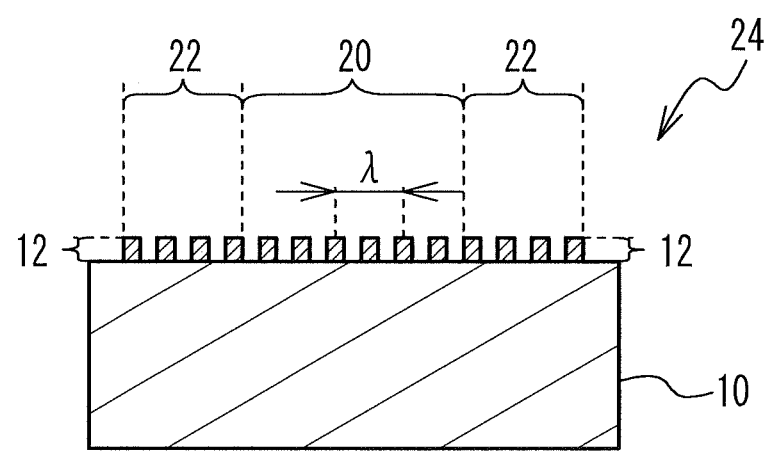
FIG. 1B is a cross-sectional view taken along line A-A in FIG. 1A.

An acoustic wave resonator will be described as an example of the acoustic wave device. FIG. 1A is a plan view of an acoustic wave resonator in a first embodiment, and FIG. 1B is a cross-sectional view taken along line A-A in FIG. 1A. As illustrated in FIG. 1A and FIG. 1B, an acoustic wave resonator 24 includes an IDT 20 and reflectors 22. The IDT 20 and the reflectors 22 are located on a piezoelectric substrate 10. The piezoelectric substrate 10 is, for example, a lithium tantalate substrate, a lithium niobate substrate, or a crystal substrate. The IDT 20 and the reflectors 22 are formed of a metal film 12. The IDT 20 includes a pair of comb-shaped electrodes 18. Each of the pair of comb-shaped electrodes 18 includes electrode fingers 14 and a bus bar 16 to which the electrode fingers 14 are coupled. The electrode fingers 14 of one of the comb-shaped electrodes 18 and the electrode fingers 14 of the other of the comb-shaped electrodes 18 are alternately arranged in at least a part of the IDT 20. The reflectors 22 are formed at the both sides of the IDT 20 in the propagation direction of the acoustic wave. The reflectors 22 reflect an acoustic wave. The pitch of the electrode fingers 14 in one comb-shaped electrode 18 is represented by $\lambda$. The pitch $\lambda$ corresponds to the wavelength of the surface acoustic wave excited by the IDT 20.

The piezoelectric substrate 10 may be bonded on a support substrate such as a silicon substrate, a sapphire substrate, an alumina substrate, a spinel substrate, a glass substrate, or a crystal substrate. In addition, an insulating film such as a silicon oxide film or a silicon nitride film may be located so as to cover the metal film 12. The film thickness of the insulating film may be greater than or less than the film thickness of the metal film 12.

When the acoustic velocity of the surface acoustic wave excited by the IDT 20 is higher than the acoustic velocity of a bulk wave propagating through the piezoelectric substrate 10 (for example, the slowest lateral bulk wave), the surface acoustic wave propagates through the surface of the piezoelectric substrate while emitting a bulk wave. Thus, loss is generated. In particular, the acoustic velocity of a Shear Horizontal (SH) wave, which is a type of surface acoustic wave, is higher than the acoustic velocity of the bulk wave. Thus, the loss of the acoustic wave resonator using the SH wave as a primary mode is large. For example, in a Y-cut X-propagation lithium tantalate substrate having a cut angle of 20° or greater and 48° or less, the SH wave is a primary mode.

To make the acoustic velocity of the acoustic surface wave low, a metal having high acoustic impedance is used for the metal film 12. The acoustic impedance Z is expressed by $$Z = \sqrt{\frac{(\rho \times E)}{2 \times (1 + Pr)}} \quad (1)$$

where a density is represented by $\rho$, a Young's modulus is represented by E, and a Poisson ratio is represented by Pr.

Since the Poisson ratio is not significantly different among metal materials, a metal with high acoustic impedance is a metal of which density×Young's modulus is large. A metal of larger atomic number has greater density, and a harder metal has higher Young's modulus. Such metals are high melting point metals having a high melting point. As described above, the use of high melting point metal for the metal film 12 decreases the acoustic velocity of the surface acoustic wave and decreases the loss.

In addition, since the high melting point metal has a large electron number and a small atomic radius, the metallic bond is strong. The electromigration is a phenomenon that metal atoms migrate due to the electric field, and the stressmigration is a phenomenon that metal atoms migrate due to stress. Thus, these migrations are unlikely to occur in high melting point metals of which the metal bond is strong. Thus, the use of high melting point metal for the metal film 12 reduces migration.

For example, aluminum (Al) typically used as the metal film 12 has a melting point of 660° C., a density of 2.7 g/cm$^3$, a Young's modulus of 68 GPa, a Poisson ratio of 0.34, and acoustic impedance of 8.3 GPa·s/m. Molybdenum (Mo), which is a high melting point metal, has a melting point of 2622° C., a density of 10.2 g/cm$^3$, a Young's modulus of 329 GPa, a Poisson ratio of 0.31, and acoustic impedance of 35.9 GPa·s/m. As described above, Mo has a melting point higher than that of Al by 2000° C., a density approximately four times greater than that of Al, a Young's modulus approximately five times greater than that of Al, and acoustic impedance approximately four times greater than that of Al.

When Mo is used as the metal film 12, the acoustic velocity of the surface acoustic wave decreases. Thus, it is considered that the loss decreases and the migration is unlikely to occur. Thus, a transmit filter for Long Term Evolution (LTE) Band28 (the transmit band is 703 MHz to 733 MHz) was fabricated by using Mo as the metal film 12.

The fabricated filter is a ladder-type filter including the acoustic wave resonator illustrated in FIG. 1A and FIG. 1B. The piezoelectric substrate 10 is a 42° Y-cut X-propagation lithium tantalate substrate. The pitch λ of the electrode fingers 14 is from 4.36 to 4.55 μm. The metal film 12 is a Mo film with a film thickness of 0.1λ.

The fabricated filter was subjected to a power durability test. In the power durability test, the environmental temperature was set at 85° C., and a non-modulated continuous wave with a frequency of 733 MHz and an electric power of 1.6 W was applied for five minutes.

Figure 2:
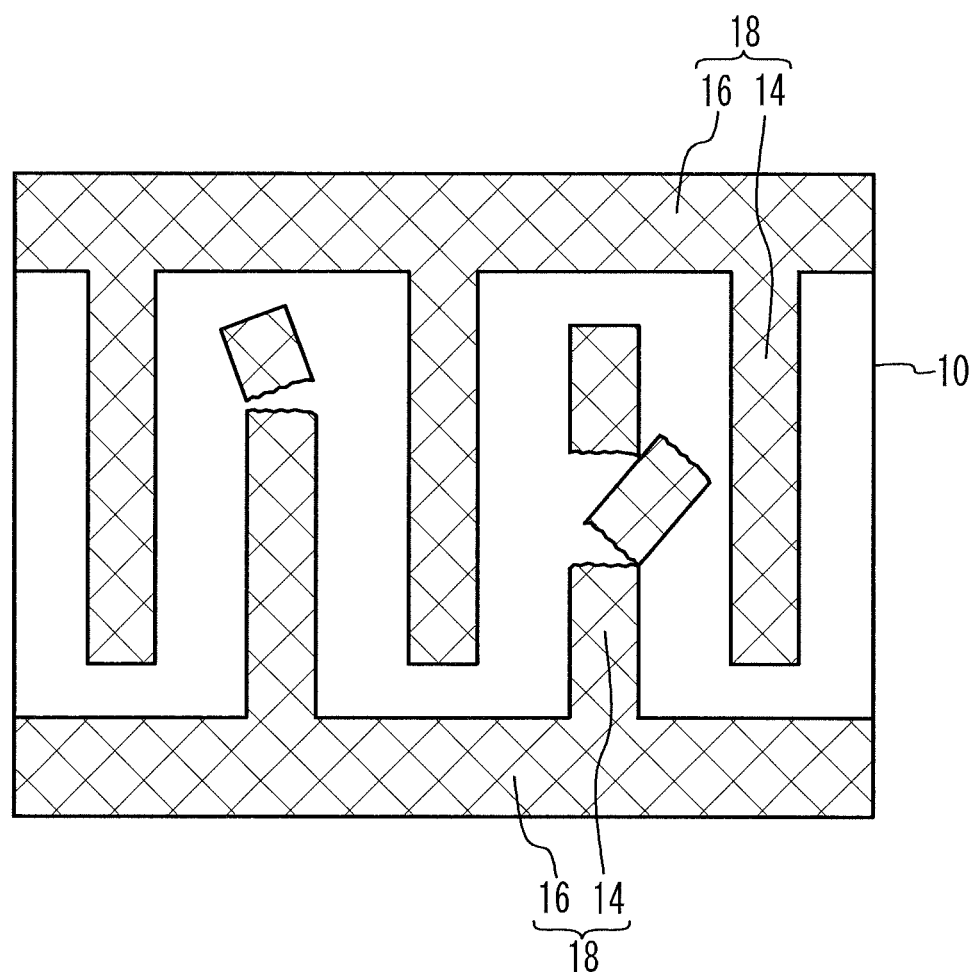
FIG. 2 is a schematic plan view of a part of a filter that was subjected to a power durability test.

FIG. 2 is a schematic plan view of a part of the filter that was subjected to the power durability test. As illustrated in FIG. 2, a part of the electrode finger 14 cracks. As seen above, when a high melting point metal is used as the metal film 12 and the power durability test is conducted, the migration does not occur, but a part of the electrode finger 14 cracks.

When a metal with a relatively low melting point, such as Al or copper (Cu), is formed on the piezoelectric substrate 10, the metal film 12 becomes polycrystalline, and crystal grains are formed. However, the grain boundary is blurred, the crystal grain sizes are irregular, and a columnar structure is not formed. On the other hand, when a high melting point metal is formed on the piezoelectric substrate 10, a columnar crystal is likely to be formed by any of evaporation and sputtering. In the columnar crystal, the grain boundary is well-defined. This is because the bond between the crystal grains is weak and/or there is a gap between the crystal grains. In addition, the crystal grain sizes are uniform, and the crystal grains are continuous in the stacking direction of the metal film 12. When a high-frequency signal with a large electric power is applied to the acoustic wave resonator 24, the surface acoustic wave greatly oscillates the electrode fingers 14, and a stress is thereby applied to the electrode fingers 14. It is considered that the electrode finger 14 cracks along the grain boundary when the electrode finger 14 has a columnar crystal.

Figure 3:
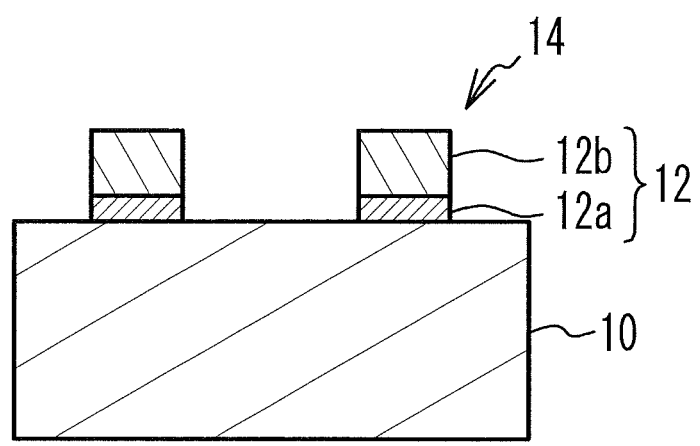
FIG. 3 is a cross-sectional view of electrode fingers in the first embodiment.

FIG. 3 is a cross-sectional view of the electrode fingers in the first embodiment. As illustrated in FIG. 3, the metal film 12 as the electrode fingers 14 is formed on the piezoelectric substrate 10. The metal film 12 has a second region 12a that is in contact with the piezoelectric substrate 10 and a first region 12b that is in contact with the second region 12a.

Figure 4:
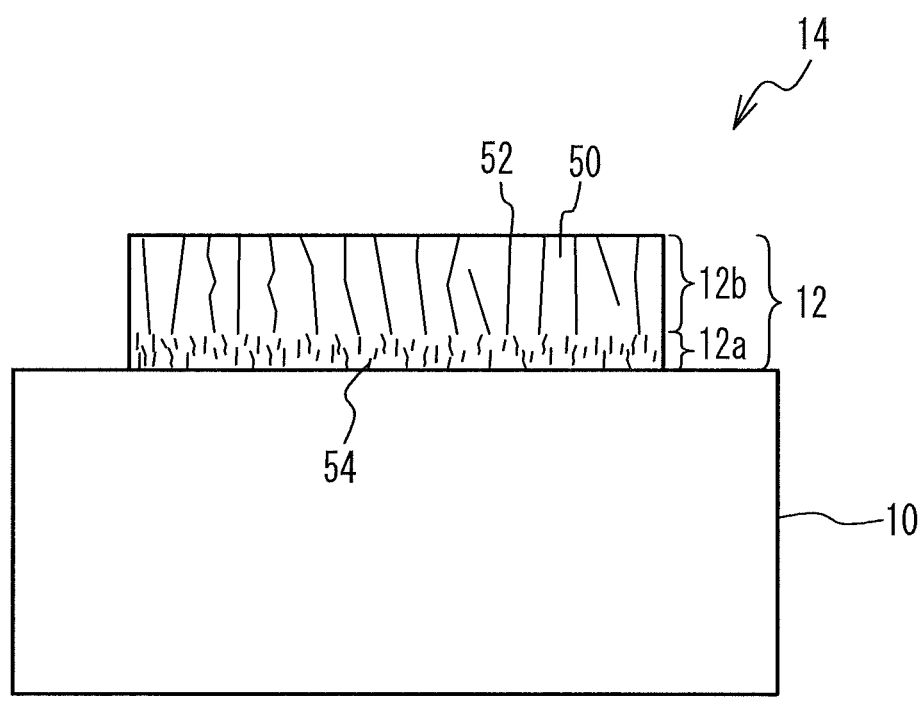
FIG. 4 is a schematic view of an electron micrograph of the cross-section of the electrode finger in the first embodiment.

FIG. 4 is a schematic view of an electron micrograph of the cross-section of the electrode finger in the first embodiment. A Mo film is used as the metal film 12. As illustrated in FIG. 4, the grain boundary is not observed in the second region 12a, and the second region 12a has a uniform structure 54. From this, it is considered that the second region 12a is in an amorphous (non-crystalline) state. In the first region 12b, a crystal grain 50 has a columnar shape in which the crystal grain 50 extends in the stacking direction, and a grain boundary 52 extends in the stacking direction. The boundary between the first region 12b and the second region 12a is blurred, and the crystal structure continuously changes. The first region 12b has a film thickness approximately a quarter of the entire thickness of the metal film 12, and the second region 12a has a film thickness approximately three-quarters of the entire film thickness of the metal film 12. Such a crystal structure is confirmed by observing the cross-section of the electrode finger 14 by Transmission Electron Microscopy (TEM) or Scanning Electron Microscopy (SEM).

A method of forming the metal film 12 in the first embodiment will be described. When a high melting point metal is formed on the piezoelectric substrate 10 having a flat surface, a columnar crystal is formed. Thus, the upper surface of the piezoelectric substrate 10 is irradiated with ions of an inert gas such as argon (Ar). This process decreases the flatness of the upper surface of the piezoelectric substrate 10. Thereafter, a high melting point metal is formed on the upper surface of the piezoelectric substrate 10. This process causes the second region 12a on the piezoelectric substrate 10 to have an amorphous structure. Thereafter, when the metal film 12 is formed, the second region 12a gradually changes to the first region 12b that has a columnar crystal.

The metal film 12 in FIG. 4 was formed by ion assisted evaporation. First, the upper surface of the piezoelectric substrate 10 was irradiated with Ar ions to make the upper surface uneven. Then, the metal film 12 was formed. This process forms the second region 12a having an amorphous structure and the first region 12b having a columnar crystal. Also in the case where the metal film 12 is formed by sputtering, before formation of the metal film 12, the upper surface of the piezoelectric substrate 10 may be reverse sputtered with Ar ions. Alternatively, by making the film forming conditions different between the second region 12a and the first region 12b, the second region 12a may be formed to have an amorphous structure and the first region 12b may be formed to have a columnar structure.

It has been known that when platinum (Pt) is formed as the metal film 12 on the piezoelectric substrate 10 by evaporation, the metal film 12 has a columnar structure. From this fact, it is considered that at least a metal having a melting point higher than that of Pt is likely to form a columnar crystal.

Table 1 lists the density, the melting point, and the lattice constant in the a-axis orientation of each of high melting point metals.

TABLE 1

| Metal | Density [g/cm³] | Melting point [° C.] | Lattice constant [Å] |
|---|---|---|---|
| Ir | 22.42 | 2454 | 3.8394 |
| Mo | 10.22 | 2622 | 3.1399 |
| Os | 22.57 | 2697 | 2.7350 |
| Pt | 21.45 | 1774 | 3.9231 |
| Re | 21.02 | 3180 | 2.7608 |
| Rh | 12.41 | 1967 | 3.7156 |
| Ru | 12.19 | 2427 | 2.7039 |
| W | 19.30 | 3382 | 3.1560 |

As presented in Table 1, iridium (Ir), Mo, osmium (Os), Pt, rhenium (Re), rhodium (Rh), ruthenium (Ru), and tungsten (W) have melting points equal to or greater than 1774° C. that is the melting point of Pt. The densities are four times or more of that of Al.

As described above, the high melting point metals having melting points equal to or greater than that of Pt have high densities and high acoustic impedance. Thus, the use of these metals as the metal film 12 decreases the acoustic velocity of the surface acoustic wave, and thereby reduces the loss. However, since the metal film 12 has a columnar structure, the power durability degrades. It may be considered to make the entire of the metal film 12 have a structure that does not have a columnar crystal to improve the power durability. However, when a high melting point metal is thickened to the extent that the high melting point metal functions as the IDT 20, the first region 12b having a columnar crystal is formed.

Thus, in the first embodiment, as illustrated in FIG. 4, the metal film 12 is mainly composed of a metal with a melting point equal to or greater than the melting point of Pt, and has the first region 12b, in which the crystal grains have columnar shapes, and the second region 12a that is located on and/or under the first region 12b in the stacking direction and has a lower crystallinity than the first region 12b or has an amorphous structure. Because of this structure, the grain boundary of the first region 12b is not continuous to the second region 12a. Thus, even when a high-frequency signal with a large electric power is input, the breakage of the electrode finger 14 is inhibited.

When the metal film 12 contains a certain metal as a main component, the metal film 12 contains the certain metal to the extent that a columnar crystal is formed, and for example, the atomic concentration of the certain metal in the metal film 12 is 50% or greater, preferably 80% or greater, further preferably 90% or greater.

The crystal grain having a columnar shape is a crystal grain of which the longitudinal direction corresponds to the stacking direction when the cross-section is observed with an electron microscope such as SEM or TEM. When the cross-section is observed with the electron microscope, the ratio of the number of crystal grains having a columnar shape to the number of all crystal grains within the visual field in the first region 12b is preferably 50% or greater, more preferably 80% or greater, further preferably 90% or greater. When the cross-section is observed with the electron microscope, the ratio of the number of crystal grains of which the largest width in the stacking direction is 1.5 times or more (or three times or more) of the largest width in the direction perpendicular to the stacking direction to the number of all crystal grains within the visual field in the first region 12b is preferably 50% or greater, more preferably 80% or greater, further preferably 90% or greater.

The second region 12a is located between the first region 12b and the piezoelectric substrate 10. Thus, the first region 12b having a columnar crystal can be formed on the second region 12a having an amorphous structure by optimizing a method of forming the metal film 12. The second region 12a may be located on the first region 12b, or may be located in the first region 12b.

The second region 12a being in contact with the piezoelectric substrate 10 can be provided by forming the metal film 12 after making the upper surface of the piezoelectric substrate 10 uneven.

The second region 12a has an amorphous structure. This structure further inhibits the electrode finger 14 from cracking in the grain boundary of the first region 12b. It is sufficient if the second region 12a has a crystallinity less than that of the first region 12b. The crystallinity can be checked by X-ray diffraction. The crystal grain in the second region 12a having less crystallinity is smaller than the crystal grain in the first region 12b.

The metal film 12 is preferably mainly composed of one of Mo, Ir, Pt, Re, Rh, Ru, tantalum (Ta), and W. This configuration increases the acoustic impedance and reduces the loss.

As disclosed in Patent Document 1, when the piezoelectric substrate 10 is a Y-cut X-propagation lithium tantalate substrate having a cut angle of 20° or greater and 48° or less and the metal film 12 is mainly composed of Mo or Cu, $T1/\lambda1$ is configured to be greater than 0.08 ($T1/\lambda1>0.08$). When the metal film 12 is mainly composed of W, $T1/\lambda1$ is configured to be greater than 0.05 ($T1/\lambda1>0.05$). When the metal film 12 is mainly composed of Ru, $T1/\lambda1$ is configured to be greater than 0.07 ($T1/\lambda1>0.07$). This configuration makes the acoustic velocity of the SH wave lower than the acoustic velocity of the bulk wave, and thereby the loss is reduced.

When the metal film 12 having a film thickness functioning as the IDT 20 (approximately $0.1\lambda$) is formed, the thickness of the first region 12b in the stacking direction is greater than the thickness of the second region 12a in the stacking direction. For example, the thickness of the first region 12b in the stacking direction is twice or more of the thickness of the second region 12a in the stacking direction. To inhibit the crack of the electrode finger 14, the thickness of the second region 12a in the stacking direction is preferably not less than one-tenth of, more preferably not less than one-fifth of the thickness of the first region 12b in the stacking direction.

When the amorphous structure is formed as the second region 12a between the piezoelectric substrate 10 and the first region 12b, the lattice constant of the piezoelectric substrate 10 does not preferably match with the lattice constant of the metal film 12. Thus, the lattice mismatch degree $\Delta$ between a film with a lattice constant of a1 and a film with a lattice constant of a2 is defined by $$\Delta[\%]=|a1-a2|/\{(\tfrac{1}{2})\times(a1+a2)\}\times 100.$$

It is considered that the second region 12a is more likely to be formed as the lattice mismatch degree $\Delta$ is larger.

Table 2 lists the density, the melting point, and the lattice constant of each of lithium niobate LN and lithium tantalate LT that are materials for the piezoelectric substrate 10.

TABLE 2

| Substrate | Density [g/cm³] | Melting point [° C.] | Lattice constant [Å] |
|---|---|---|---|
| LN | 4.64 | 1250 | 5.148 |
| LT | 7.46 | 1650 | 5.154 |

Table 3 lists the lattice mismatch degree $\Delta$ [%] between LN and the metals in Table 1 and the lattice mismatch degree $\Delta$ [%] between LT and the metals in Table 1.

TABLE 3

| | LN [%] | LT [%] |
|---|---|---|
| Ir | 29.23 | 29.12 |
| Mo | 48.57 | 48.46 |
| Os | 61.33 | 61.22 |
| Pt | 27.12 | 27.01 |
| Re | 60.47 | 60.37 |
| Rh | 32.43 | 32.32 |
| Ru | 62.36 | 62.25 |
| W | 48.09 | 47.98 |

To form the second region 12a, the lattice mismatch degree $\Delta$ between the piezoelectric substrate 10 and the metal film 12 is preferably 25% or greater, more preferably 40% or greater. As presented in Table 3, for all the metals, $\Delta$ is 25% or greater. For Mo, Os, Re, Ru, and W, $\Delta$ is 40% or greater.

First Variation of the First Embodiment

Figure 5A:
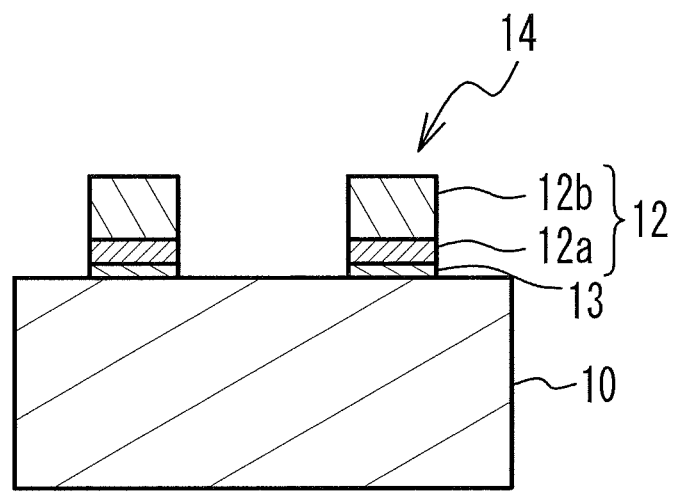
FIG. 5A is a cross-sectional view of electrode fingers in a first variation of the first embodiment.

FIG. 5A is a cross-sectional view of electrode fingers in a first variation of the first embodiment. As illustrated in FIG. 5A, an intermediate film 13 is located between the metal film 12 and the piezoelectric substrate 10. The intermediate film 13 is an adhesion layer between the metal film 12 and the piezoelectric substrate 10, and is mainly composed of at least one of, for example, chrome (Cr), nickel (Ni), and Ti. Other configurations are the same as those of the first embodiment, and the description thereof is thus omitted.

Table 4 lists the density, the melting point, and the lattice constant of each of Cr, Ni, and Ti used as the intermediate film 13.

TABLE 4

| Intermediate film | Density [g/cm$^3$] | Melting point [° C.] | Lattice constant [Å] |
|---|---|---|---|
| Cr | 7.20 | 1900 | 2.8796 |
| Ni | 8.90 | 1455 | 3.5240 |
| Ti | 4.54 | 1727 | 3.5900 |

Table 5 lists the lattice mismatch degree Δ [%] between Cr, Ni, and Ti and the metals in Table 1. As presented in Table 5, the densities of Cr, Ni, and Ti are less than those of the metals in Table 1. In addition, the melting points of Cr, Ni, and Ti are lower than those of most metals in Table 1.

TABLE 5

|    | Cr [%] | Ni [%] | Ti [%] |
|---|---|---|---|
| Ir | 28.57 | 8.57  | 6.71  |
| Mo | 8.65  | 11.53 | 13.38 |
| Os | 5.15  | 25.21 | 27.04 |
| Pt | 30.68 | 10.72 | 8.87  |
| Re | 4.21  | 24.29 | 26.11 |
| Rh | 25.35 | 5.29  | 3.44  |
| Ru | 6.29  | 26.34 | 28.16 |
| W  | 9.16  | 11.02 | 12.87 |

When the intermediate film 13 is located between the piezoelectric substrate 10 and the metal film 12, it is considered that the second region 12a is more likely to be formed as the lattice mismatch degree Δ between the intermediate film 13 and the metal film 12 becomes larger. To form the second region 12a, the lattice mismatch degree Δ between the intermediate film 13 and the metal film 12 is preferably 4% or greater, more preferably 8% or greater.

As in the first variation of the first embodiment, the intermediate film 13 mainly composed of a metal with a lower density than Pt may be located between the piezoelectric substrate 10 and the second region 12a. The intermediate film 13 is preferably thinner than the second region 12a so as not to affect the acoustic impedance.

Second Variation of the First Embodiment

Figure 5B:
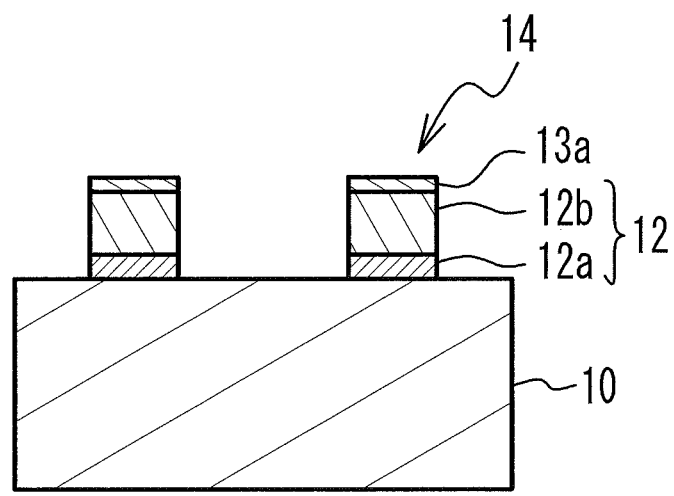
FIG. 5B is a cross-sectional view of electrode fingers in a second variation of the first embodiment.

FIG. 5B is a cross-sectional view of electrode fingers in a second variation of the first embodiment. As illustrated in FIG. 5B, an upper film 13a is located on the metal film 12. The upper film 13a is mainly composed of at least one of, for example, chrome (Cr), nickel (Ni), and Ti. Other structures are the same as those of the first embodiment, and the description thereof is thus omitted.

As in the second variation of the first embodiment, the upper film 13a may be located on the metal film 12. As in the first and second variations of the first embodiment, the electrode finger 14 has a multilayered structure in which one or more metal films are stacked, and it is sufficient if at least one metal layer includes the first region 12b and the second region 12a. The sum of the film thicknesses of the first region 12b and the second region 12a is preferably 50% or more of, more preferably 80% or more of the film thickness of the electrode finger 14.

Third Variation of the First Embodiment

Figure 6A:
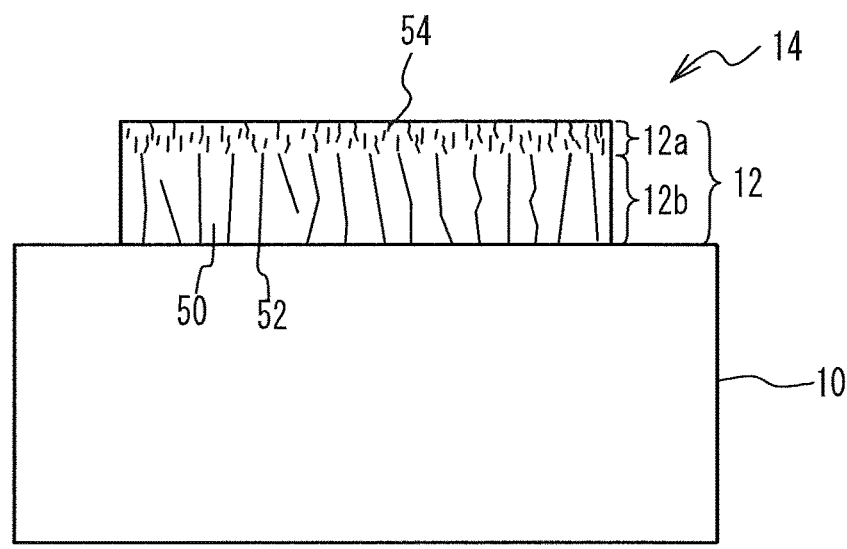
FIG. 6A through FIG. 6C are schematic cross-sectional views of electrode fingers in third through fifth variations of the first embodiment, respectively.

FIG. 6A is a schematic cross-sectional view of an electrode finger in a third variation of the first embodiment. As illustrated in FIG. 6A, in the third variation of the first embodiment, the crystal grain 50 has a columnar shape, the first region 12b in which the grain boundary 52 extends in the stacking direction is in contact with the upper surface of the piezoelectric substrate 10, and the second region 12a having the uniform structure 54 is located on the first region 12b. Other structures are the same as those of the first embodiment, and the description thereof is thus omitted. As in the first variation of the first embodiment, the uppermost layer of the comb-shaped electrode 18 may be the second region 12a. This structure inhibits the electrode finger 14 from cracking from the upper surface of the electrode finger 14 when a large electric power is applied. The location in which the second region 12a is to be located can be set according to the location that is likely to be the starting point of the cracking of the electrode finger 14 when a large electric power is applied.

Fourth Variation of the First Embodiment

Figure 6B:
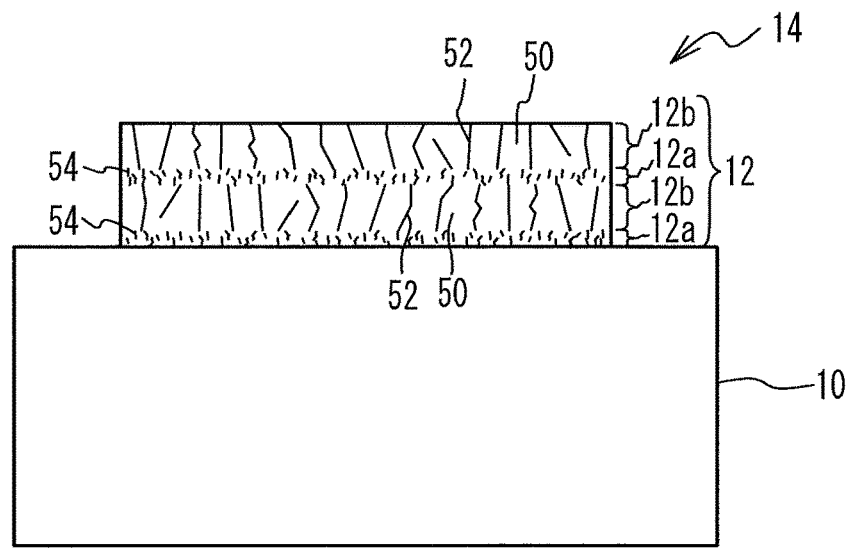

FIG. 6B is a schematic cross-sectional view of an electrode finger in a fourth variation of the first embodiment. As illustrated in FIG. 6B, in the fourth variation of the first embodiment, the first regions 12b and the second regions 12a are alternately stacked, and the region closest to the piezoelectric substrate 10 is the second region 12a. Other structures are the same as those of the first embodiment, and the description thereof is thus omitted.

Fifth Variation of the First Embodiment

Figure 6C:
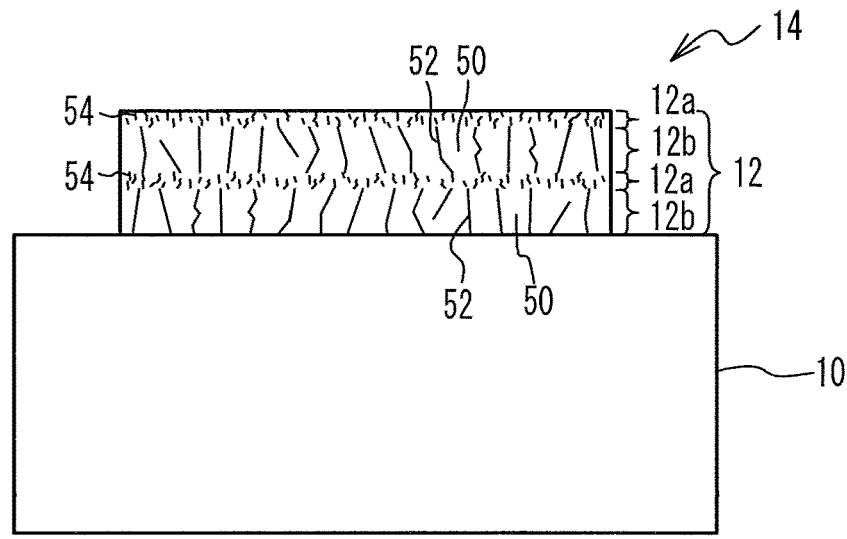

FIG. 6C is a schematic cross-sectional view of an electrode finger in a fifth variation of the first embodiment. As illustrated in FIG. 6C, in the fifth variation of the first embodiment, the first regions 12b and the second regions 12a are alternately stacked, and the region closest to the piezoelectric substrate 10 is the first region 12b. Other structures are the same as those of the first embodiment, and the description thereof is thus omitted.

As in the fourth and fifth variations of the first embodiment, the first regions 12b and the second regions 12a may be alternately stacked. This structure further inhibits the cracking of the electrode finger 14. Thus, the breakage of the IDT by a large electric power is inhibited. Alternatively, the second region 12a may be located between the two first regions 12b. The first region 12b may be located between the two second regions 12a. As described above, it is sufficient if the second region 12a is located on and/or under the first region 12b in the stacking direction.

Figure 7A:
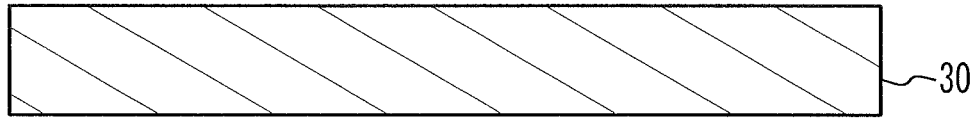
FIG. 7A through FIG. 7D are cross-sectional views illustrating a method of forming the electrode fingers in the third variation of the first embodiment.
Figure 7B:
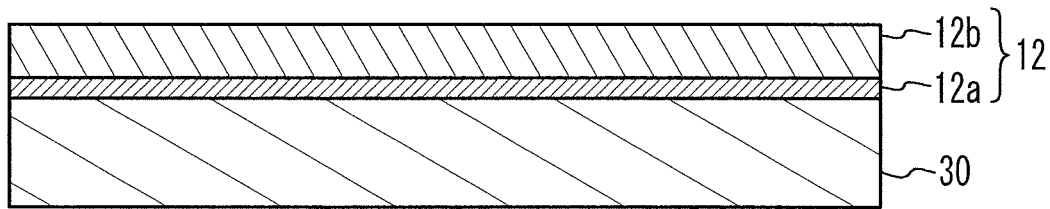

FIG. 7A through FIG. 7D and FIG. 8A through FIG. 8C are cross-sectional views illustrating a method of forming the electrode fingers in the third variation of the first embodiment. As illustrated in FIG. 7A, a dummy substrate 30 is prepared. The dummy substrate 30 has a flat upper surface, and is, for example, a silicon substrate. As illustrated in FIG. 7B, the metal film 12 is formed on the dummy substrate 30. The metal film 12 is formed by, for example, ion assisted evaporation or sputtering as in the first embodiment. This process causes the metal film 12 to be the second region 12a and the first region 12b in this order from the dummy substrate 30 side.

Figure 7C:
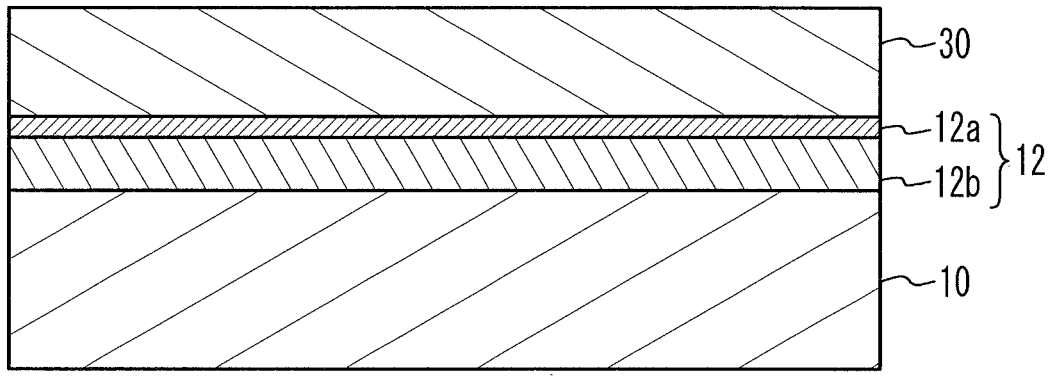
Figure 7D:
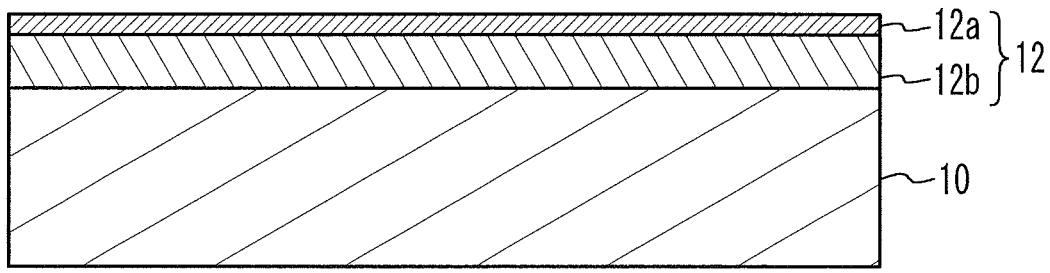

As illustrated in FIG. 7C, the metal film 12 is bonded onto the upper surface of the piezoelectric substrate 10. Examples of the bonding method includes, but are not limited to, a method that activates the upper surface of the piezoelectric substrate 10 and the lower surface of the metal film 12 by Fast Atomic Beam (FAB), and then bonds them together at normal temperature. This process causes the metal film 12 to be the first region 12b and the second region 12a in this order from the piezoelectric substrate 10 side. As illustrated in FIG. 7D, the dummy substrate 30 is removed from the metal film 12. The dummy substrate 30 is removed by, for example, by polishing or grinding.

Figure 8A:
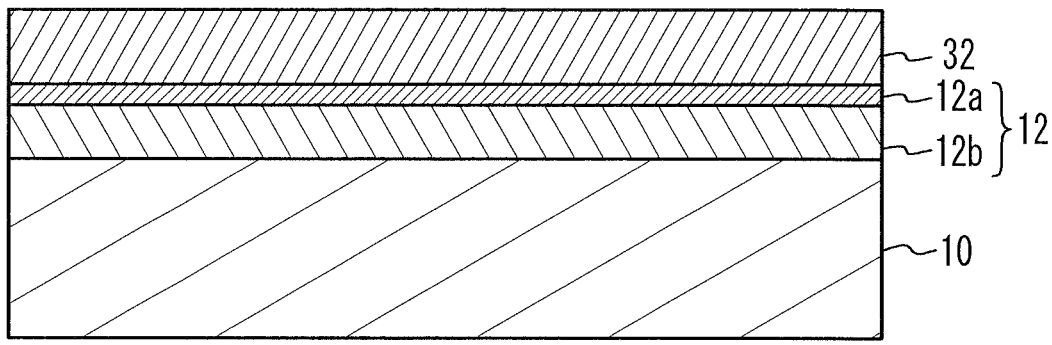
FIG. 8A through FIG. 8C are cross-sectional views illustrating the method of forming the electrode fingers in the third variation of the first embodiment.
Figure 8B:
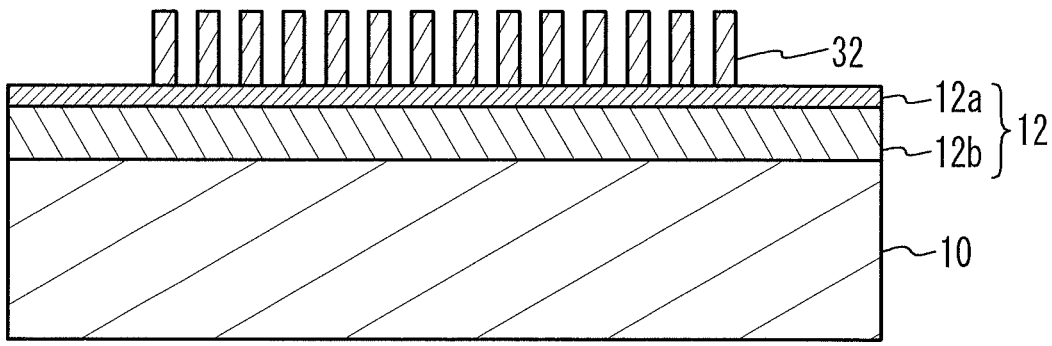
Figure 8C:
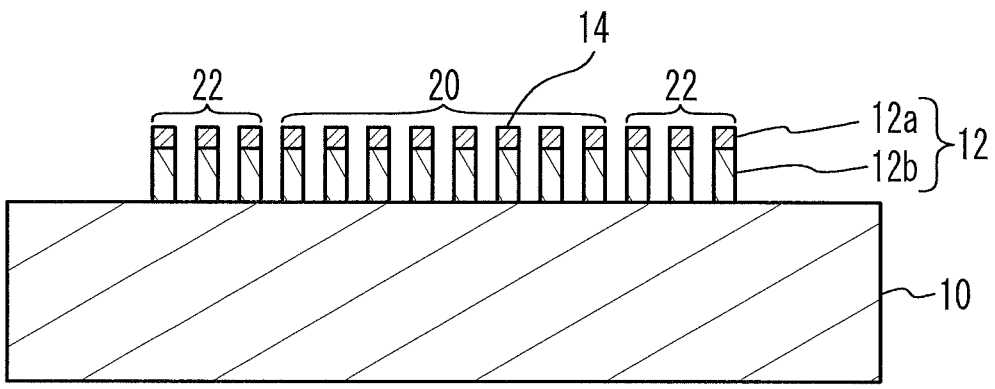

As illustrated in FIG. 8A, a mask layer 32 is formed on the metal film 12. The mask layer 32 is formed of, for example, photoresist. As illustrated in FIG. 8B, the mask layer 32 is patterned by exposure and development. As illustrated in FIG. 8C, the IDT 20 and the reflectors 22 of the third variation of the first embodiment are formed by etching the metal film 12 using the mask layer 32 as a mask.

The first regions 12b and the second regions 12a can be alternately stacked as in the fourth and fifth variations of the first embodiment by repeating the steps of FIG. 7A through FIG. 7D two or more times.

Second Embodiment

Figure 9A:
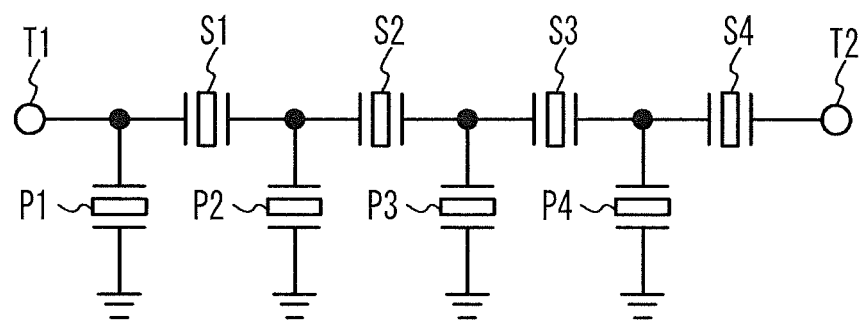
FIG. 9A is a circuit diagram of a filter in accordance with a second embodiment.

A second embodiment is an exemplary filter and an exemplary duplexer including the acoustic wave resonator according to any one of the first embodiment and the variations thereof. FIG. 9A is a circuit diagram of a filter in accordance with the second embodiment. As illustrated in FIG. 9A, one or more series resonators S1 through S4 are connected in series between an input terminal T1 and an output terminal T2. One or more parallel resonators P1 through P4 are connected in parallel between the input terminal T1 and the output terminal T2. At least one of the one or more series resonators S1 through S4 and the one or more parallel resonators P1 through P4 can be the acoustic wave resonator according to any one of the first embodiment and the variations thereof.

Figure 9B:
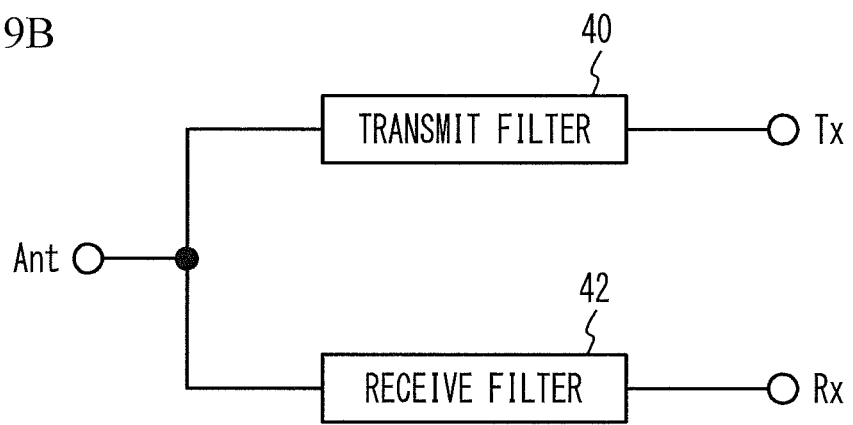
FIG. 9B is a circuit diagram of a duplexer in accordance with a first variation of the second embodiment.

FIG. 9B is a circuit diagram of a duplexer in accordance with a first variation of the second embodiment. As illustrated in FIG. 9B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 can be the filter of the second embodiment.

A duplexer has been described as an example of the multiplexer, but the multiplexer may be a triplexer or a quadplexer.

Third Embodiment

Figure 10:
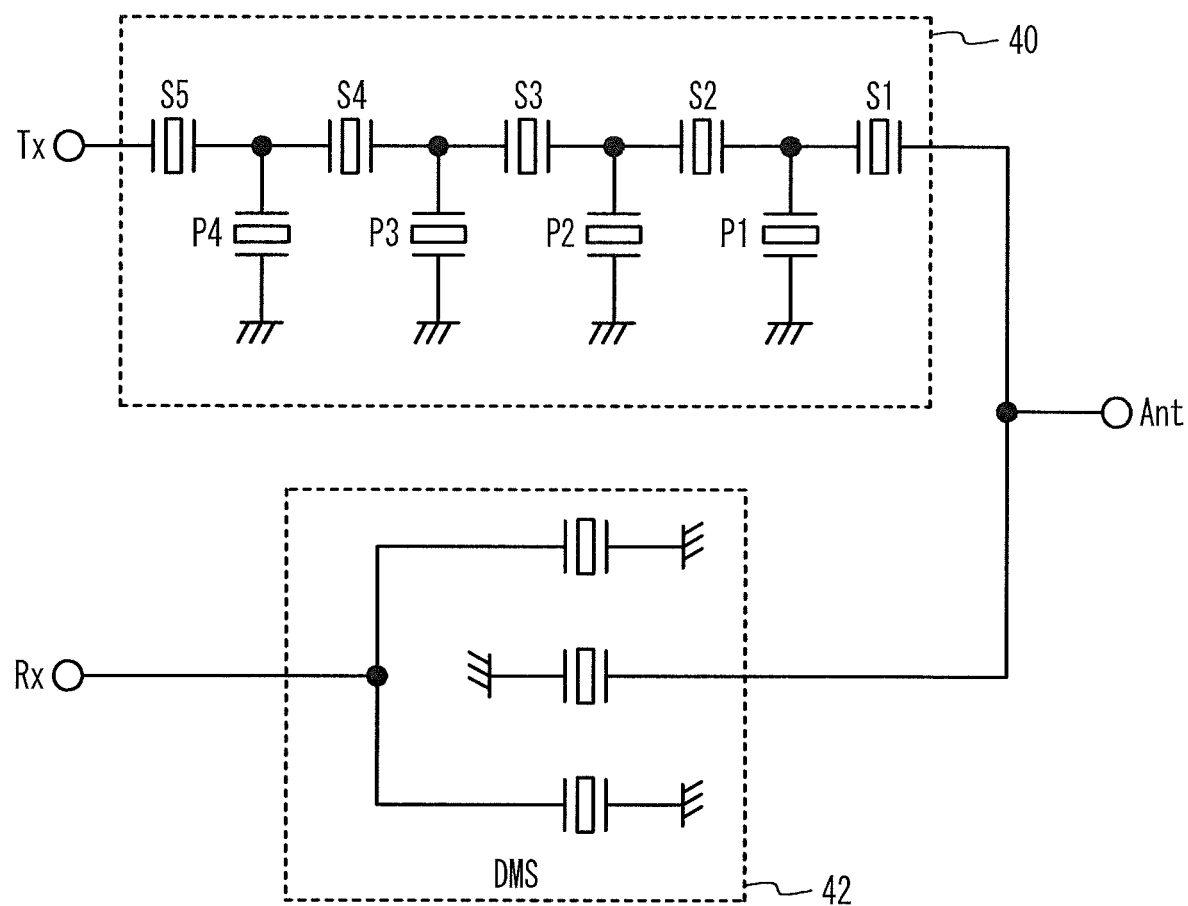
FIG. 10 is a circuit diagram of a multiplexer in accordance with a third embodiment.

FIG. 10 is a circuit diagram of a multiplexer in accordance with a third embodiment. As illustrated in FIG. 10, the transmit filter 40 is connected between the common terminal Ant and the transmit terminal Tx. The receive filter 42 is connected between the common terminal Ant and the receive terminal Rx.

The transmit filter 40 is a ladder-type filter, and includes series resonators S1 through S5 and parallel resonators P1 through P4. The series resonators S1 through S5 are connected in series to the path between the common terminal Ant and the transmit terminal Tx. First ends of the parallel resonators P1 through P4 are connected to the path between the common terminal Ant and the transmit terminal Tx, and second ends are connected to ground terminals. The number of the series resonators S1 through S5 and the number of the parallel resonators P1 through P4 are set so that desired characteristics are achieved. The receive filter 42 is a longitudinally coupled multimode filter DMS. The multimode filter is, for example, a double mode filter.

The transmit filter 40 transmits signals in the transmit band to the common terminal Ant among high-frequency signals input from the transmit terminal Tx, and suppresses signals with other frequencies. The receive filter 42 transmits signals in the receive band to the receive terminal Rx among high-frequency signals input from the common terminal Ant, and suppresses signals with other frequencies. The transmit band does not overlap with the receive band. In this example, the transmit band is lower than the receive band. Thus, the transmit filter 40 is required to have large attenuation in the receive band higher than the passband in frequency. The receive filter 42 is required to have large attenuation in the transmit band lower than the passband in frequency. Thus, a ladder-type filter is used as the transmit filter 40, and a multimode filter is used as the receive filter 42. When the transmit band is higher than the receive band, a ladder-type filter is used as a receive filter, and a multimode filter is used as a transmit filter. That is, a ladder-type filter is used for a filter having a low transmission characteristic, and a multimode filter is used for a filter having a high transmission characteristic.

Figure 11A:
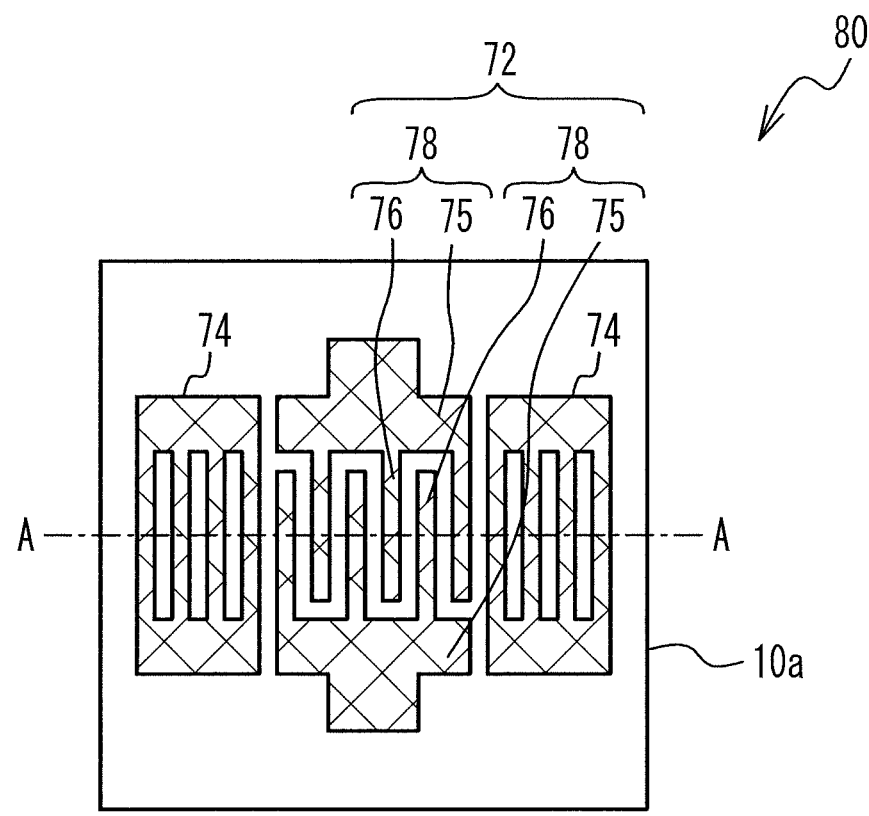
FIG. 11A is a plan view of an acoustic wave resonator used in a transmit filter in the third embodiment.
Figure 11B:
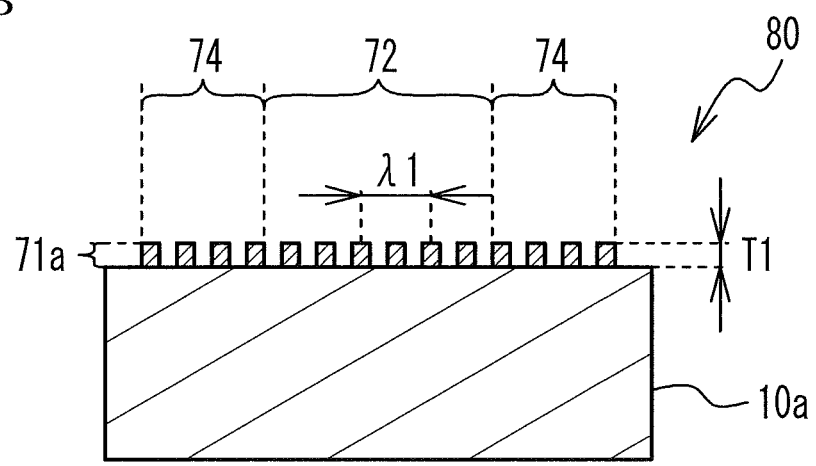
FIG. 11B is a cross-sectional view taken along line A-A in FIG. 11A.

FIG. 11A is a plan view of an acoustic wave resonator used in a transmit filter in the third embodiment, and FIG. 11B is a cross-sectional view taken along line A-A in FIG. 11A. As illustrated in FIG. 11A and FIG. 11B, an acoustic wave resonator 80 includes an IDT 72 and reflectors 74. The IDT 72 and the reflectors 74 are located on a piezoelectric substrate 10a. The piezoelectric substrate 10a is a lithium tantalate substrate or a lithium niobate substrate. The IDT 72 and the reflectors 74 are formed of a metal film 71a. The IDT 72 includes a pair of comb-shaped electrodes 78. Each of the pair of comb-shaped electrodes 78 includes electrode fingers 76 and a bus bar 75 to which the electrode fingers 76 are coupled. The electrode fingers 76 of the pair of comb-shaped electrodes 78 form grating electrodes. The electrode fingers 76 of one of the comb-shaped electrodes 78 and the electrode fingers 76 of the other of the comb-shaped electrodes 78 are alternately arranged in at least a part of the IDT 72. The reflectors 74 are located at the both sides of the IDT 72 in the propagation direction of the acoustic wave. The reflectors 74 reflect the acoustic wave. The film thickness of the metal film 71a is represented by T1, the pitch of the grating electrodes (the pitch of the electrode fingers 76 in one comb-shaped electrode 78) is represented by λ1. The pitch λ1 corresponds to the wavelength of the surface acoustic wave excited by the IDT 72.

When the acoustic velocity of the surface acoustic wave excited by the IDT 72 is higher than the acoustic velocity of a bulk wave propagating through the piezoelectric substrate 10a (for example, the slowest lateral bulk wave), the surface acoustic wave propagates through the surface of the piezoelectric substrate while emitting a bulk wave. Thus, loss is generated. In particular, the acoustic velocity of the Shear Horizontal (SH) wave, which is a type of surface acoustic wave, is higher than the acoustic velocity of the bulk wave. Thus, the loss of the acoustic wave resonator 80 using the SH wave as a primary mode is large. For example, in a Y-cut X-propagation lithium tantalate substrate having a cut angle of 80° or greater and 48° or less, the SH wave is a primary mode.

To make the acoustic velocity of the surface acoustic wave low, the metal film 71a is made of a metal with high acoustic impedance, and is thickened. The acoustic impedance Z is expressed by $$Z = \sqrt{\frac{(\rho \times E)}{2 \times (1 + Pr)}} \quad (2)$$

where the density is represented by $\rho$, the Young's modulus is represented by E, and the Poisson ratio is represented by Pr.

Table 6 lists the density, the Young's modulus, the Poisson ratio, and the acoustic impedance of each of copper (Cu), tungsten (W), ruthenium (Ru), molybdenum (Mo), and aluminum (Al). As presented in Table 6, the acoustic impedance of Cu, W, Ru, and Mo is two times or more of that of Al.

TABLE 6

|  | Cu | W | Ru | Mo | Al |
|---|---|---|---|---|---|
| Density [g/cm$^3$] | 8.92 | 19.25 | 12.37 | 10.28 | 2.70 |
| Young's modulus [GPa] | 130 | 411 | 447 | 329 | 68 |
| Poisson ratio | 0.34 | 0.28 | 0.30 | 0.31 | 0.34 |
| Acoustic impedance [GPa · s/m] | 20.8 | 55.6 | 46.1 | 35.9 | 8.3 |

For example, when the piezoelectric substrate 10a is an X-propagation lithium tantalate substrate having a cut angle of 20° or greater and 48° or less, and the metal film 71a is mainly composed of Mo or Cu, T1/λ1 is configured to be greater than 0.08 (T1/λ1>0.08). When the metal film 71a is mainly composed of W, T1/λ1 is configured to be greater than 0.05 (T1/λ1>0.05). When the metal film 71a is mainly composed of Ru, T1/λ1 is greater than 0.07 (T1/λ1>0.07). This configuration makes the acoustic velocity of the SH wave lower than the acoustic velocity of the bulk wave, thus reducing the loss.

Figure 12A:
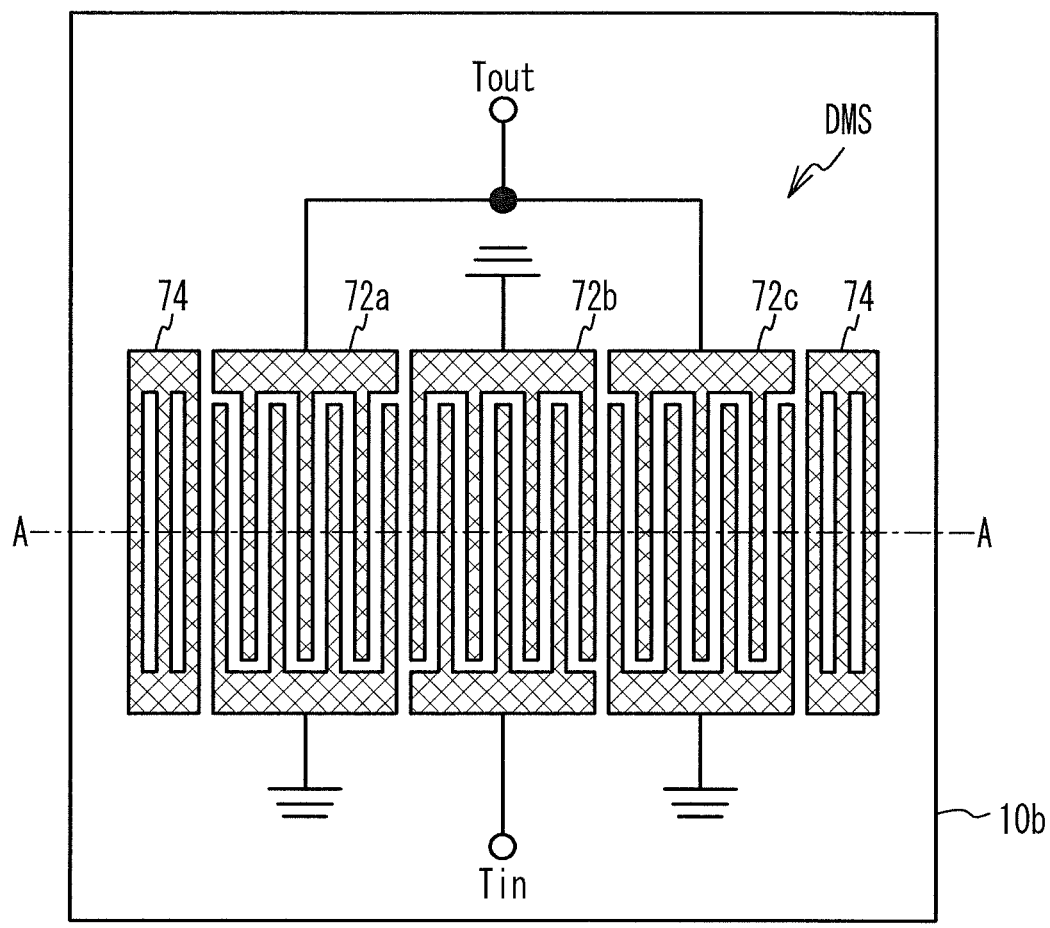
FIG. 12A is a plan view of a multimode filter used as a receive filter in the third embodiment.
Figure 12B:
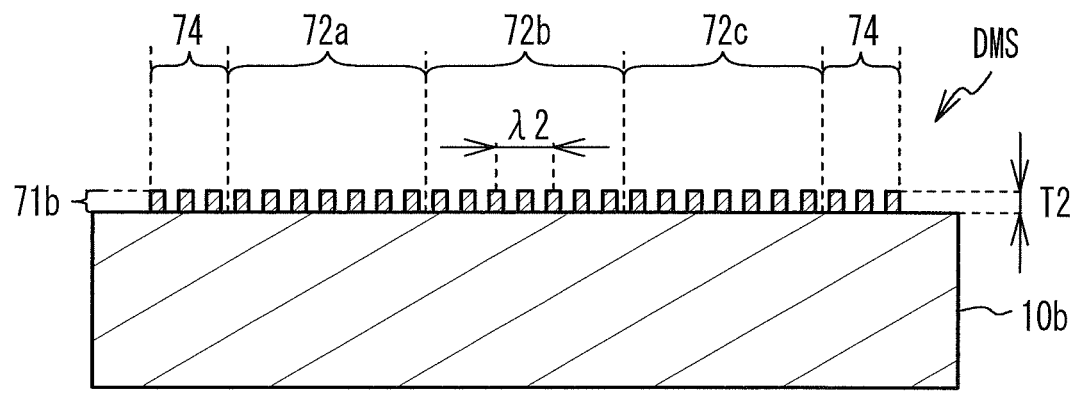
FIG. 12B is a cross-sectional view taken along line A-A in FIG. 12A.

FIG. 12A is a plan view of a multimode filter used as a receive filter in the third embodiment, and FIG. 12B is a cross-sectional view taken along line A-A in FIG. 12A. As illustrated in FIG. 12A and FIG. 12B, the multimode filter DMS includes IDTs 72a through 72c and the reflectors 74. The IDTs 72a through 72c and the reflectors 74 are located on a piezoelectric substrate 10b. The piezoelectric substrate 10b is a lithium tantalate substrate or a lithium niobate substrate. The IDTs 72a through 72c have the same structure as the IDT 72, and the description thereof is thus omitted. The IDTs 72a through 72c are arranged in the propagation direction of the surface acoustic wave. The reflectors 74 are located outside the IDTs 72a through 72c. The IDTs 72a through 72c and the reflectors 74 are formed of a metal film 71b.

A first end of the IDT 72b is coupled to an input terminal Tin (the common terminal Ant in FIG. 10), and a second end is coupled to a ground terminal. A first end of the IDT 72a and a first end of the IDT 72c are commonly coupled to an output terminal Tout (the receive terminal Rx in FIG. 10). A second end of the IDT 72a and a second end of the IDT 72c are coupled to ground terminals. The film thickness of the metal film 71b is represented by T2, and the pitch of the grating electrodes is represented by λ2. The pitch λ2 corresponds to the wavelength of the surface acoustic wave excited by the IDTs 72a through 72c.

The transmission characteristics were simulated with use of the finite element method for the third embodiment in which the metal film 71b is an Al film and a first comparative example in which the metal film 71b is a Mo film. A multimode filter having two IDTs 72a and 72b was simulated.

Figure 13A:
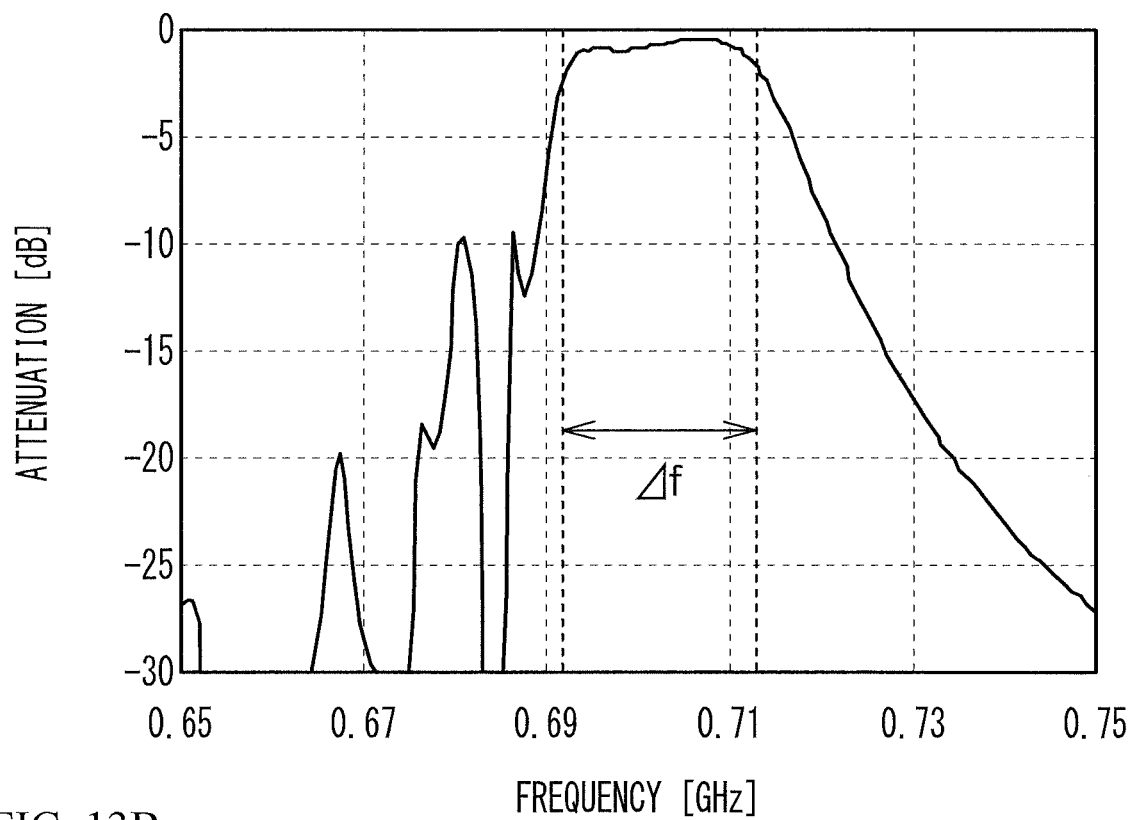
FIG. 13A illustrates the transmission characteristic of a multimode filter in a first comparative example.
Figure 13B:
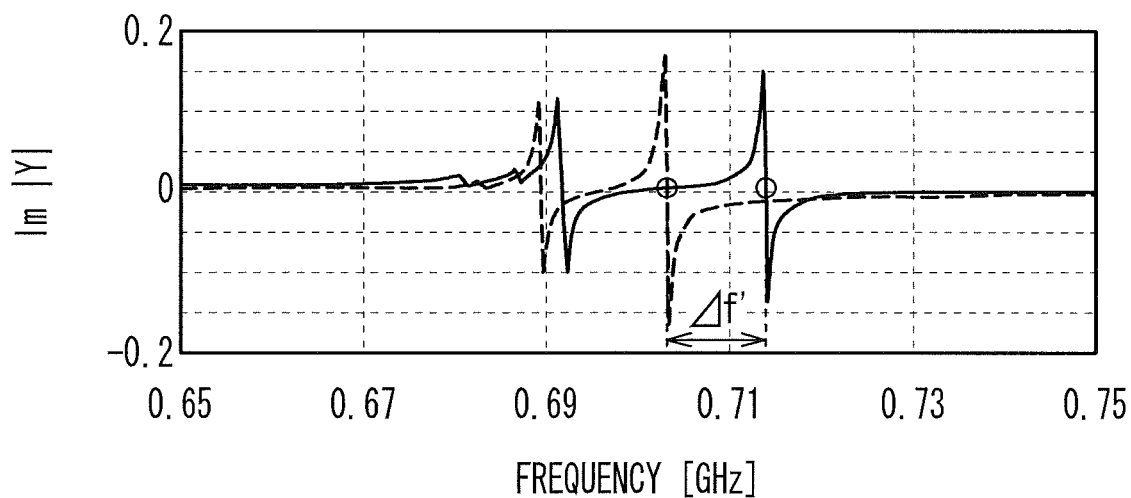
FIG. 13B illustrates the imaginary part Im|Y| of admittance.

Simulation conditions are as follows.
Number of pairs in the IDT 72a: 30 pairs
Number of pairs in the IDT 72b: 30 pairs
Number of pairs in one reflector 74: 10 pairs
Piezoelectric substrate 10b: 42° Y-cut X-propagation lithium tantalate
Material of the metal film 71b: Al (in the third embodiment), Mo (in the first comparative example)
Film thickness T2 of the metal film 71b/λ2: 0.1
Pitch λ2: 5.0 μm FIG. 13A illustrates the transmission characteristic of a multimode filter in the first comparative example, and FIG. 13B is a graph of the imaginary part Im|Y| of admittance. As illustrated in FIG. 13A, in the first comparative example, the fractional bandwidth Δf is 2.8%. The fractional bandwidth is a ratio of the bandwidth of the passband to the center frequency of the passband. As illustrated in FIG. 13B, the difference Δf' in resonant frequency (open circles) between an even (secondary) mode indicated by a solid line and an odd (primary) mode indicated by a dashed line is small.

Figure 14A:
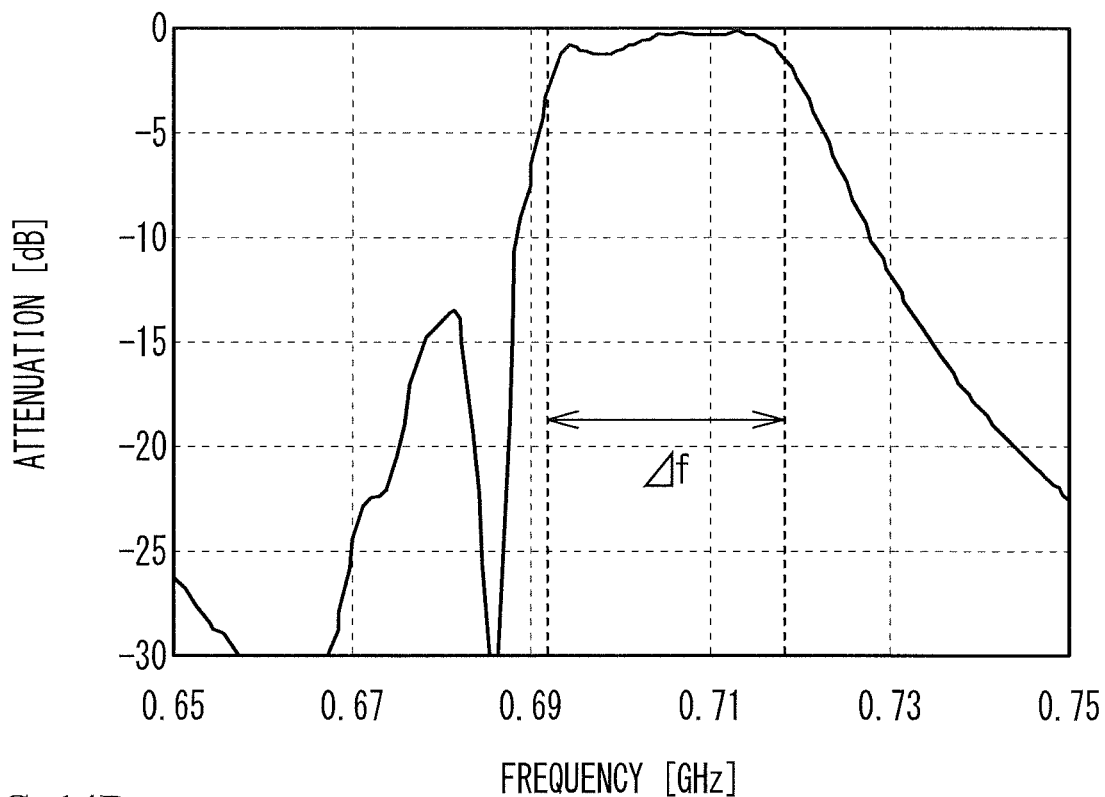
FIG. 14A illustrates the transmission characteristic of the multimode filter in the third embodiment.
Figure 14B:
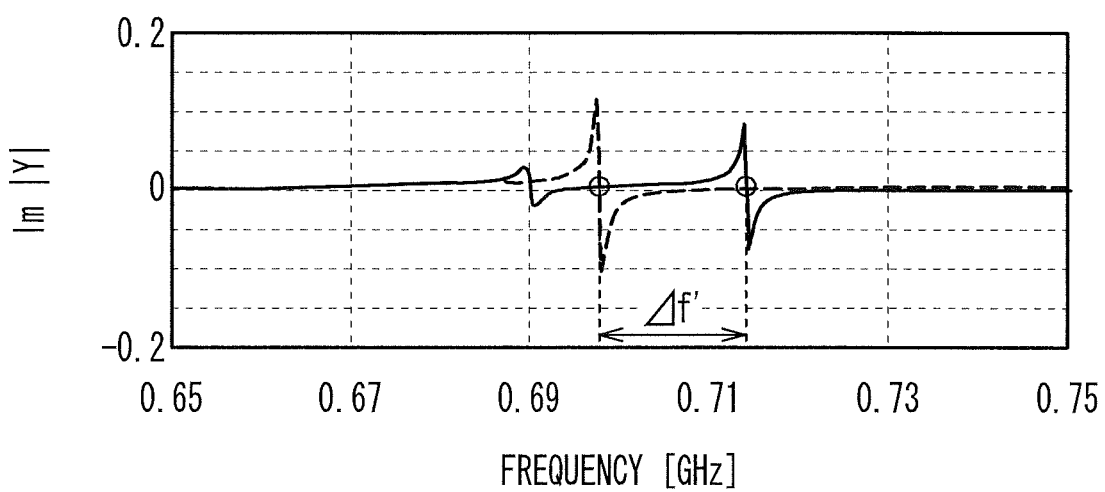
FIG. 14B illustrates the imaginary part Im|Y| of admittance.

FIG. 14A illustrates the transmission characteristic of the multimode filter in the third embodiment, and FIG. 14B illustrates the imaginary part Im|Y| of admittance. As illustrated in FIG. 14A, in the third embodiment, the fractional bandwidth Δf is 3.5%. As illustrated in FIG. 14B, the difference Δf' in resonant frequency (open circles) between the even mode indicated by a solid line and the odd mode indicated by a dashed line is greater than that in the first comparative example illustrated in FIG. 13B. Accordingly, the fractional bandwidth Δf of the third embodiment is greater than that of the first comparative example.

The fractional bandwidth of the filter for a mobile phone system is required to be 3% to 4%. Thus, the fractional bandwidth of the first comparative example is too small. The reason why the fractional bandwidth is small in the first comparative example is because the difference in resonant frequency between the even mode and the odd mode is small. This is considered because the reflection coefficient of the surface acoustic wave excited by the grating electrodes in the first comparative example is too large. For example, the reflection coefficient κ12 per unit length of the short-circuited grating electrode in the first comparative example is 0.54 when calculated by the finite element method. The reflection coefficient κ12 is determined by the difference between the acoustic impedance in the region where the electrode finger 76 of the grating electrode is located and the acoustic impedance in the region where no electrode finger 76 is formed. Thus, when the acoustic impedance of the grating electrode is large, the reflection coefficient κ12 is large.

In the third embodiment, Al with low acoustic impedance as presented in Table 6 is used as the metal film 71*b*. The calculated reflection coefficient κ12 in the third embodiment is 0.2. This is considered as the reason why the fractional bandwidth Δf in the third embodiment is large. The above simulation was conducted for the multimode filter having two IDTs, but when a multimode filter having three IDTs is used and a first-order mode-third-order mode coupled multimode filter is used, 4% or greater of the fractional bandwidth Δf can be achieved.

As described above, in the third embodiment, the metal film 71*a* with high acoustic impedance is used in the transmit filter 40. This configuration reduces the loss of the transmit filter 40. For example, when the piezoelectric substrate 10*a* is a lithium tantalate substrate, the acoustic velocity of the lateral bulk wave is 3400 m/s. Thus, the material and the film thickness of the metal film 71*a* are configured so that the acoustic velocity of the surface acoustic wave is 3200 m/s or less. For example, the metal film 71*a* is configured to be a Mo film with a film thickness of 0.1×λ1. For example, in the transmit filter 40 for the transmit band, which is from 703 MHz to 733 MHz, of the LTE Band28, λ1 is set as approximately 4.36 μm to 4.55 μm.

In the receive filter 42, the metal film 71*b* with low acoustic impedance is used. This configuration makes the fractional bandwidth of the receive filter 42 large. For example, the metal film 71*b* is configured to be an Al film with a film thickness of 0.1×λ2. In the receive filter 42 for the receive band, which is from 758 MHz to 788 MHz, of the LTE Band28, λ1 is set as 5.07 μm to 5.27 μm.

When the transmit filter 40 is configured to be a ladder-type filter, the steepness at the high frequency side of the passband is increased. Thus, the attenuation characteristic of the transmit filter 40 in the receive band is improved. When the receive filter 42 is configured to be a multimode filter, the steepness at the low frequency side of the passband is increased. Thus, the attenuation characteristic of the receive filter in the transmit band is improved.

First Through Third Variations of the Third Embodiment

Figure 15A:
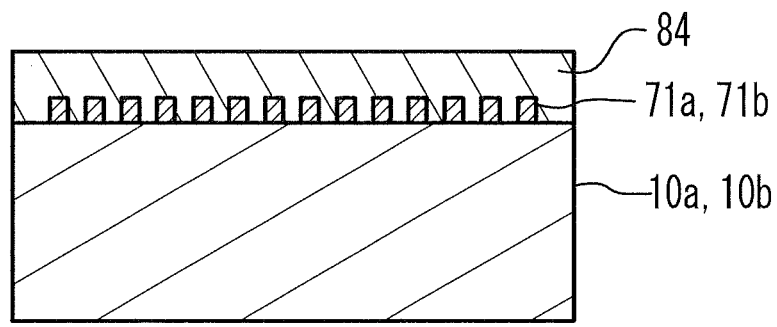
FIG. 15A through FIG. 15C are cross-sectional views of resonators in accordance with first through third variations of the third embodiment, respectively.
Figure 15B:
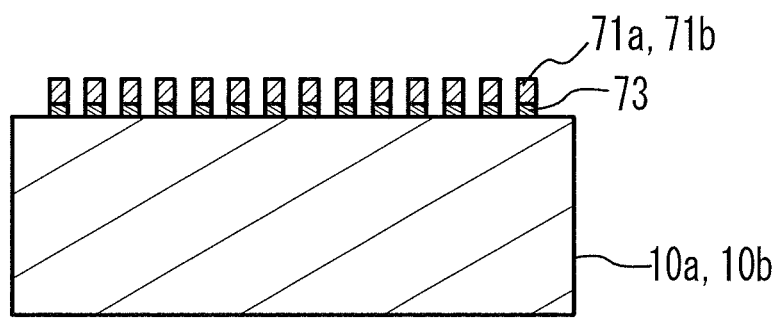
Figure 15C:
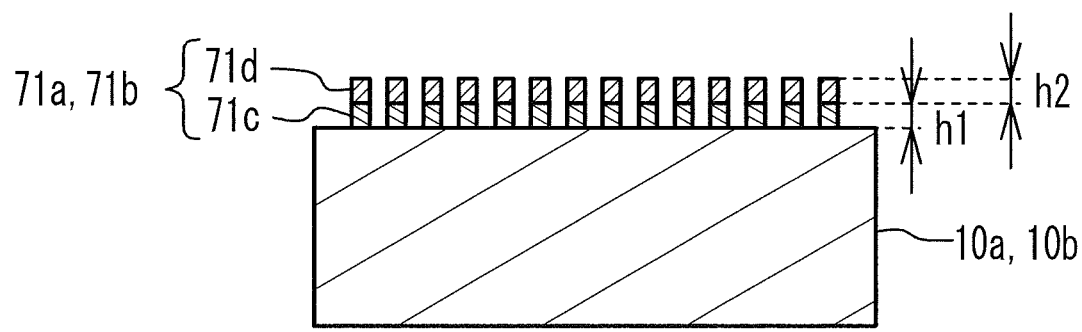

FIG. 15A through FIG. 15C are cross-sectional views of resonators in accordance with first through third variations of the third embodiment. As illustrated in FIG. 15A, a dielectric film 84 is formed on the piezoelectric substrate 10*a* and/or 10*b* so as to cover the metal film 71*a* and/or 71*b*. The dielectric film 84 is a film for frequency adjustment and/or temperature change compensation. For example, a silicon oxide film, a silicon nitride film, or an aluminum oxide film can be used as the dielectric film 84. The piezoelectric substrates 10*a* and 10*b* may be bonded on a support substrate such as a silicon substrate, a sapphire substrate, an alumina substrate, a spinel substrate, a glass substrate, or a crystal substrate.

As illustrated in FIG. 15B, an adhesion layer 73 may be formed between the metal film 71*a* and/or 71*b* and the piezoelectric substrate 10*a* and/or 10*b*. The adhesion layer 73 is a film for improving adherence between the metal film 71*a* and/or 71*b* and the piezoelectric substrate 10*a* and/or 10*b*. For example, titanium (Ti) or chrome (Cr) can be used as the adhesion layer 73. The material of the adhesion layer 73 is more lightweight and thinner than the metal film 71*a* and/or 71*b*. Thus, the presence or absence of the adhesion layer 73 hardly affects the acoustic impedance of the grating electrode.

As illustrated in FIG. 15C, the metal film 71*a* and/or 71*b* may be formed of metal films 71*c* and 71*d* that are stacked. In this case, the acoustic impedance $Z_{all}$ of the metal film 71*a* or 71*b* is calculated by $$Z_{all} = \Sigma_{i=1}^{n} Z_i(t_i/t_{all}) \quad (3)$$

wherein represents the acoustic impedance of the metal film at an i layer, $t_i$ represents the film thickness of the metal film at an i layer, and $t_{all}$ represents the film thickness of the metal film 71*a* or 71*b*. The film thickness $t_i$ corresponds to the film thicknesses h1 and h2 of the metal films 71*a* and 71*b*, and the film thickness $t_{all}$ corresponds to the film thickness T1 or T2.

In the third embodiment, the ladder-type filter is electrically connected between the common terminal Ant and the transmit terminal Tx (a first terminal), and includes the series resonators S1 through S5 and the parallel resonators P1 through P4 (resonators). At least one of the series resonators S1 through S5 and the parallel resonators P1 through P4 includes the IDT 72 (a first IDT) formed of the metal film 71*a* (a first metal film) located on the piezoelectric substrate 10*a* (a first piezoelectric substrate). The multimode filter DMS is electrically connected between the common terminal Ant and the receive terminal Rx (a second terminal), and includes the IDTs 72*a* through 72*c* (second IDTs) formed of the metal film 71*b* (a second metal film) located on the piezoelectric substrate 10*b* (a second piezoelectric substrate). The multimode filter has a passband higher than the passband of the ladder-type filter.

When the passband of the multimode filter is higher than the passband of the ladder-type filter, it is commonly known that the average pitch λ2 of the grating electrodes of each of the IDTs 72*a* through 72*c* of the multimode filter is less than the average pitch λ1 of the grating electrodes of the IDTs 72 of all the series resonators S1 through S5 and the parallel resonators P1 through P4 of the ladder-type filter.

However, in the above described multiplexer, to reduce the loss of the ladder-type filter, the acoustic impedance of the metal film 71*a* is made to be high, and to further widen the band of the multimode filter, the acoustic impedance of the metal film 71*b* is made to be low. The acoustic velocity of the surface acoustic wave excited by the first grating electrodes formed of the metal film 71*a* becomes low. Thus, the average pitch λ2 of the grating electrodes of at least one of the IDTs 72*a* through 72*c* of the multimode filter becomes greater than the average pitch λ1 of the grating electrodes of the IDT 72 of at least one of the series resonators S1 through S5 and the parallel resonators P1 through P4 of the ladder-type filter. The average pitch of the IDT is obtained by dividing the width of the IDT in the propagation direction of the surface acoustic wave by the number of pairs of the electrode fingers 76.

The average pitch λ2 is preferably 1.05 times or more of, more preferably 1.1 times or more of the average pitch λ1.

To further reduce the loss of the ladder-type filter and further widen the band of the multimode filter, the average pitch λ2 of the grating electrodes of all the IDTs 72*a* through 72*c* of the multimode filter is preferably greater than the average pitch λ1 of the grating electrodes of the IDTs 72 of all the series resonators S1 through S5 and the parallel resonators P1 through P4 of the ladder-type filter.

The acoustic impedance of the grating electrodes of the IDTs 72*a* through 72*c* is less than the acoustic impedance of the grating electrodes of the IDT 72. Accordingly, the loss of the ladder-type filter is further reduced, and the band of the multimode filter is further widened. The acoustic impedance of the grating electrodes of the IDTs 72*a* through 72*c* is preferably one half of the acoustic impedance of the grating electrodes of the IDT 72 or less, more preferably one-third of the acoustic impedance of the grating electrodes of the IDT 72 or less.

When the metal film 71a and/or 71b includes metal films of different materials that are stacked, the acoustic impedance of the metal film 71a and/or 71b is calculated by the expression (3).

The film thickness T2 of the metal film 71b is preferably 0.5 times or more and 1.5 times or less of the film thickness T1 of the metal film 71a, more preferably 0.8 times or more and 1.2 times or less of the film thickness T1 of the metal film 71a.

The metal film 71a preferably includes a metal film mainly composed of at least one of Cu, W, Ru, Mo, tantalum (Ta), platinum (Pt), palladium (Pd), iridium (Ir), rhodium (Rh), rhenium (Re), and tellurium (Te) as a material having high acoustic impedance. The metal film 71b preferably includes a metal film mainly composed of Al as a material having low acoustic impedance. When the metal film is mainly composed of a certain element, the metal film contains the certain element to the extent that the advantage of the third embodiment is achieved, and the atomic concentration of the certain element in the metal film is, for example, 50% or greater, more preferably 80% or greater, further preferably 90% or greater. For example, the metal film 71b may be made of Al containing Cu of a small atomic %.

The acoustic wave excited by the grating electrodes of the IDTs 72 and 72a through 72c is mainly an SH wave. Since the acoustic velocity of the SH wave is greater than the acoustic velocity of the bulk wave, the loss is larger. Thus, the average pitch λ2 is preferably made to be greater than the average pitch λ1.

As described in Patent Document 1, when the piezoelectric substrate 10a and the piezoelectric substrate 10b are Y-cut X-propagation lithium tantalate substrates having a cut angle of 20° or greater and 48° or less, the excited surface acoustic wave is the SH wave.

As described in Patent Document 1, when the piezoelectric substrate 10a is a Y-cut X-propagation lithium tantalate substrate having a cut angle of 20° or greater and 48° or less, the metal film 71a is formed of one or more metal films (third metal films) that are stacked. In this case, when pi represents the density of each of one or more third metal films, Pi represents the Poisson ratio of each third metal film, hi represents the film thickness of each third metal film, ρ0 represents the density of Cu, P0 represents the Poisson ratio of Cu, and λ1 represents the average pitch, the sum of (hi/λ)×(ρi/ρ0)×(Pi/P0) in each third metal film of the one or more third metal films is made to be greater than 0.08. This configuration makes the acoustic velocity of the SH wave lower than the acoustic velocity of the bulk wave, and the loss can be reduced.

Fourth Embodiment

Figure 16A:
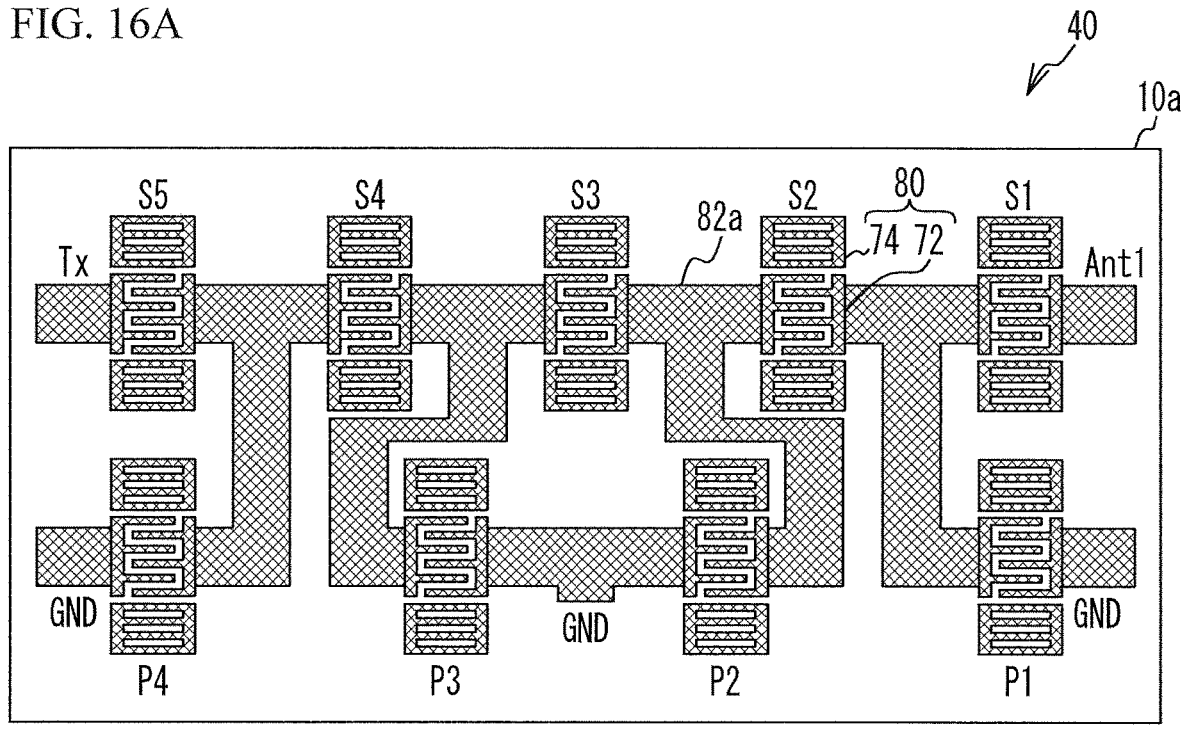
FIG. 16A and FIG. 16B are plan views of a transmit filter and a receive filter in a fourth embodiment, respectively.
Figure 16B:
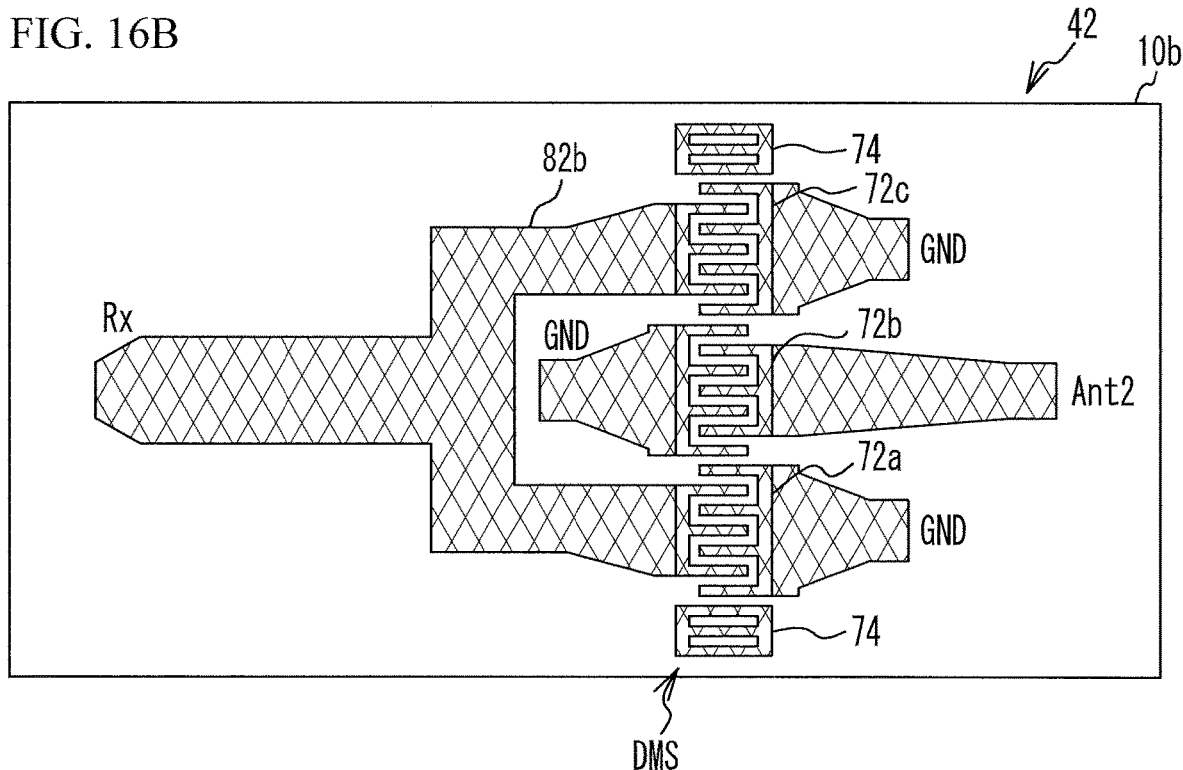

FIG. 16A and FIG. 16B are plan views of a transmit filter and a receive filter in accordance with a fourth embodiment, respectively. As illustrated in FIG. 16A, the transmit filter 40 includes the series resonators S1 through S5 and the parallel resonators P1 through P4 as the acoustic wave resonators 80 on the piezoelectric substrate 10a. The acoustic wave resonators 80 are electrically interconnected by wiring lines 82a. The wiring line 82a includes the metal film 71a. The wiring line 82a may be formed by stacking metal films having low resistivity, such as an Au film or a Cu film, on the metal film 71a. A common terminal Ant1, the transmit terminal Tx, and ground terminals GND are formed of the wiring lines 82a.

As illustrated in FIG. 16B, the receive filter 42 includes the multimode filter DMS located on the piezoelectric substrate 10b. A common terminal Ant2, the receive terminal Rx, and the ground terminals GND are formed of wiring lines 82b. The common terminal Ant2, the receive terminal Rx, and the ground terminals GND and the IDTs 72a through 72c are electrically interconnected by the wiring lines 82b. The wiring line 82b includes the metal film 71b. The wiring line 82b may be formed by stacking metal films with low resistivity, such as an Au film or a Cu film, on the metal film 71b. The common terminals Ant1 and Ant2 are connected outside the piezoelectric substrates 10a and 10b. Other structures are the same as those of the third embodiment, and the description thereof is thus omitted.

As in the fourth embodiment, the transmit filter 40 and the receive filter 42 may be respectively located on the different piezoelectric substrates 10a and 10b. One of the piezoelectric substrates 10a and 10b may be a lithium tantalate substrate, and the other may be a lithium niobate substrate. Both the piezoelectric substrates 10a and 10b may be lithium tantalate substrates or lithium niobate substrates.

First Variation of the Fourth Embodiment

Figure 17:
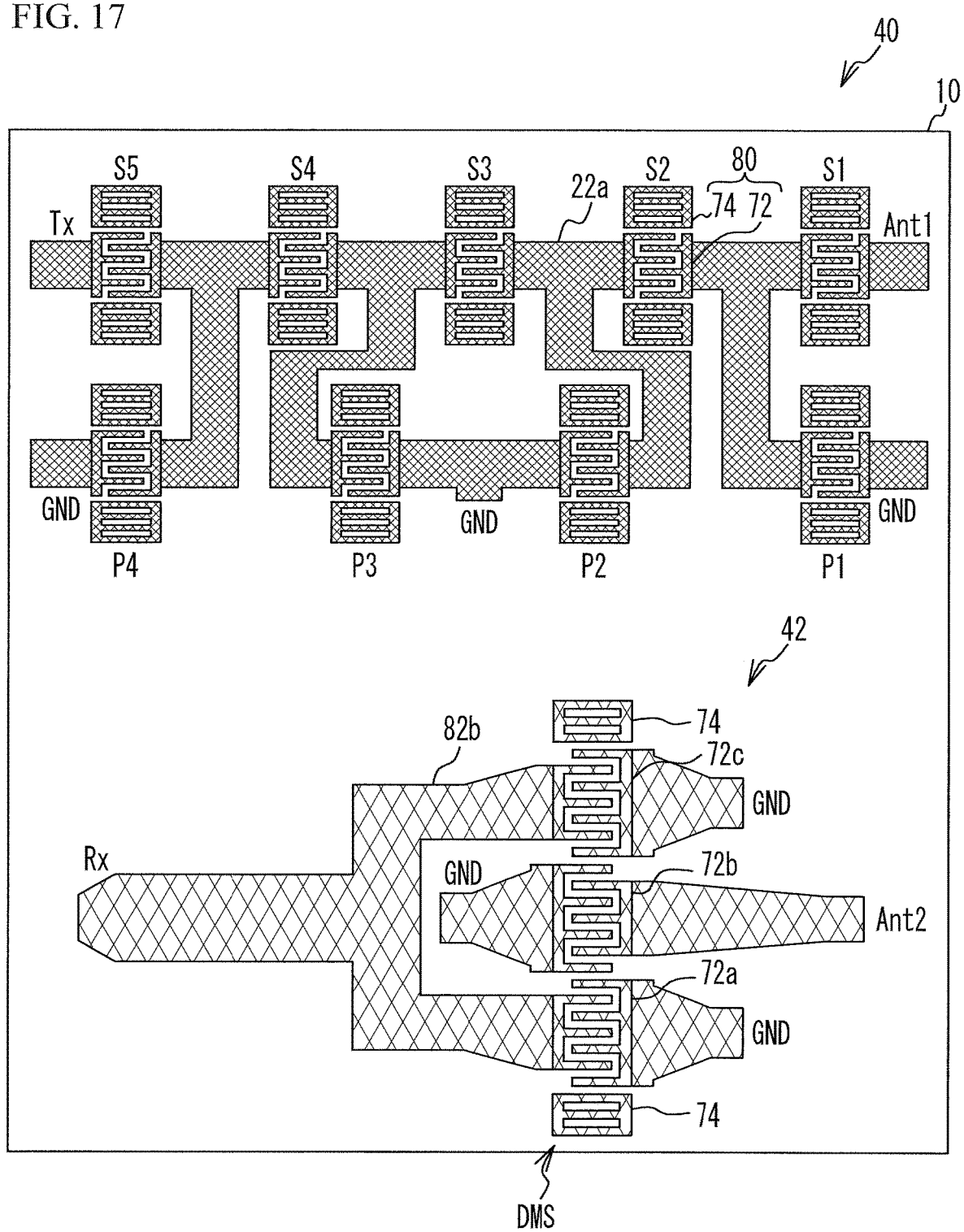
FIG. 17 is a plan view of a transmit filter and a receive filter in a first variation of the fourth embodiment.

FIG. 17 is a plan view of a transmit filter and a receive filter in a first variation of the fourth embodiment. As illustrated in FIG. 17, the transmit filter 40 and the receive filter 42 are located on the single piezoelectric substrate 10. As illustrated, when the first piezoelectric substrate and the second piezoelectric substrate are the single piezoelectric substrate 10 and the acoustic velocity of the surface acoustic wave in the ladder-type filter is attempted to be low, the band of the multimode filter is difficult to be widen. Thus, λ2 is preferably made to be greater than λ1. Other structures are the same as those of the fourth embodiment, and the description thereof is thus omitted.

Second Variation of the Fourth Embodiment

FIG. 18A is a plan view of a transmit filter and a receive filter in accordance with a second variation of the fourth embodiment, and FIG. 18B is a cross-sectional view taken along line A-A in FIG. 18A. As illustrated in FIG. 18A, the common terminal Ant is located on the piezoelectric substrate 10. As illustrated in FIG. 18B, the wiring lines 82a and the IDTs 72 are formed of the metal film 71a, and the wiring lines 82b and the IDTs 72a through 72c are formed of the metal film 71b. Other structures are the same as those of the first variation of the fourth embodiment, and the description thereof is thus omitted.

Third Variation of the Fourth Embodiment

Figure 19A:
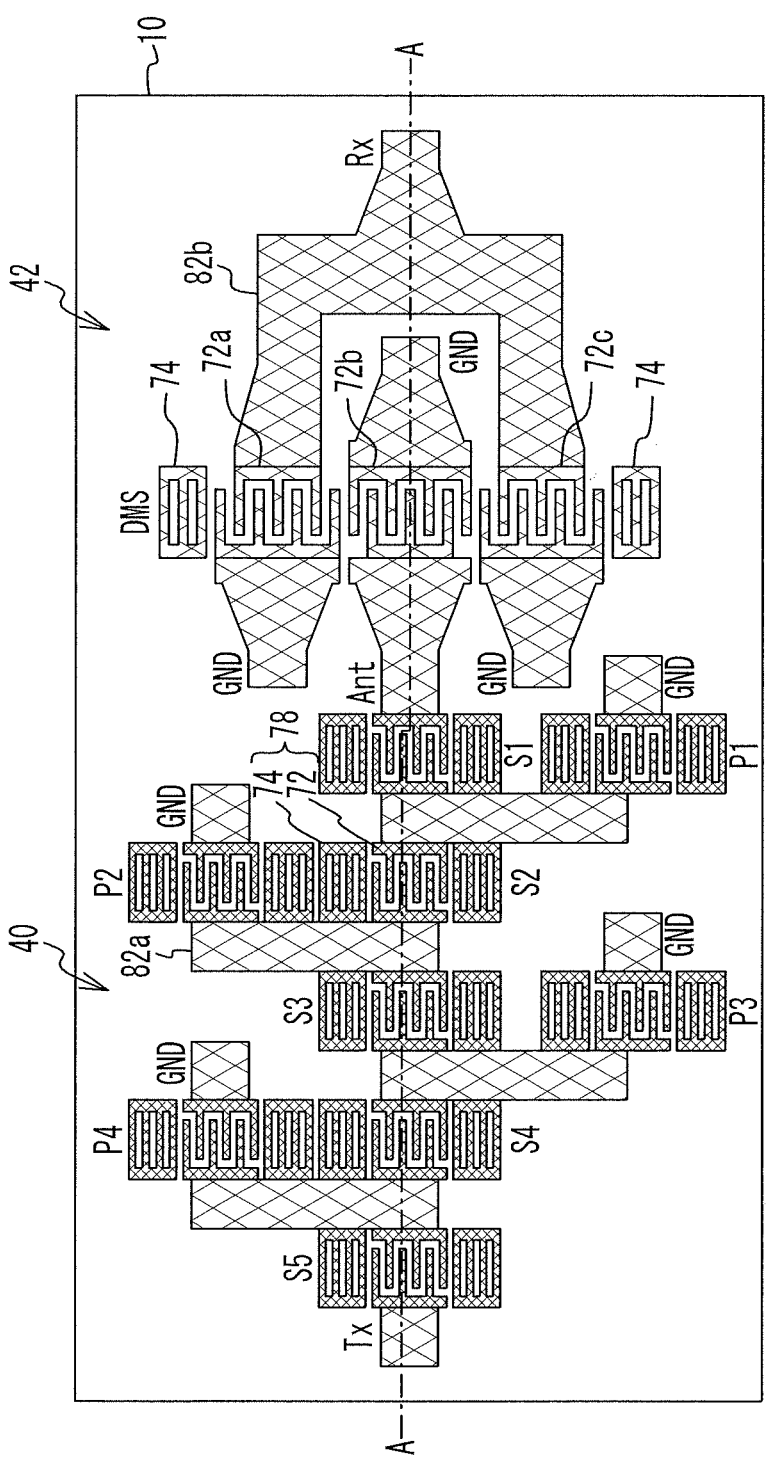
FIG. 19A is a plan view of a transmit filter and a receive filter in accordance with a third variation of the fourth embodiment.
Figure 19B:
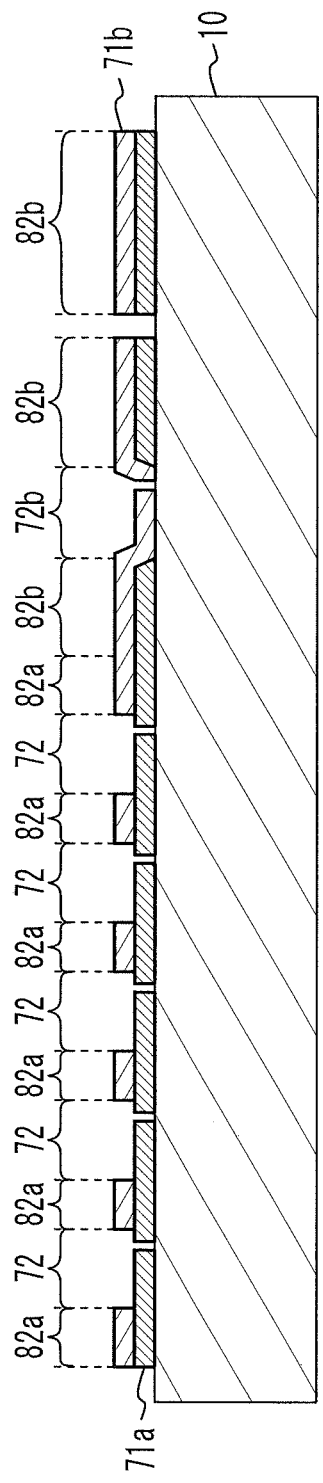
FIG. 19B is a cross-sectional view taken along line A-A in FIG. 19A.

FIG. 19A is a plan view of a transmit filter and a receive filter in accordance with a third variation of the fourth embodiment, and FIG. 19B is a cross-sectional view taken along line A-A in FIG. 19A. As illustrated in FIG. 19A and FIG. 19B, the IDTs 72 are formed of the metal film 71a, and the IDTs 72a through 72c are formed of the metal film 71b. The wiring lines 82a and 82b are formed of the metal film 71a and the metal film 71b that are stacked. Other structures are the same as those of the second variation of the fourth embodiment, and the description thereof is thus omitted.

The wiring lines 82a (first wiring lines) electrically connect the series resonators S1 through S5 and the parallel resonators P1 through P4, and the metal films 71a and 71b are stacked in at least a part of the wiring line 82a. The wiring lines 82b (second wiring lines) electrically connect the multimode filter DMS and the common terminal Ant and/or the receive terminal Rx, and the metal films 71a and 71b are stacked in at least a part of the wiring line 82b. This structure reduces the resistances of the wiring lines 82a and 82b without adding an excessive fabrication step.

Fifth Embodiment

Figure 20:
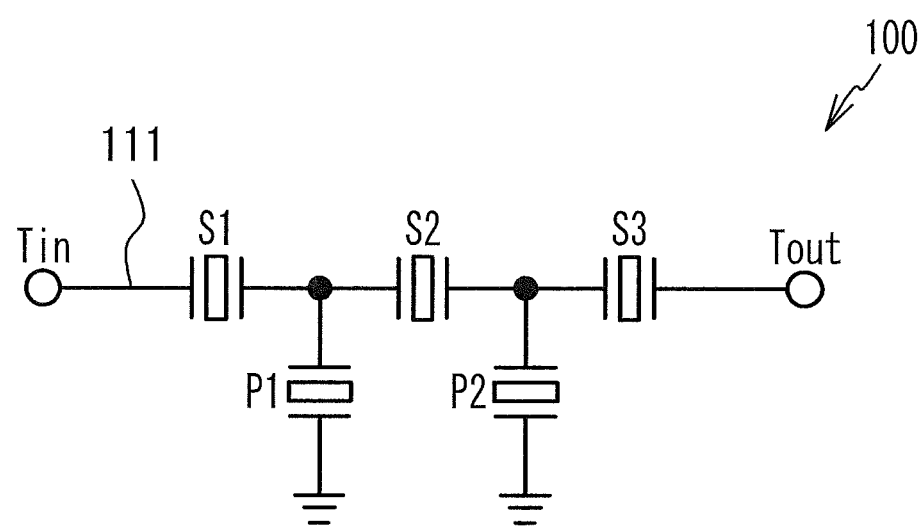
FIG. 20 is a circuit diagram of a ladder-type filter in accordance with a fifth embodiment.

FIG. 20 is a circuit diagram of a ladder-type filter 100 in accordance with a fifth embodiment. As illustrated in FIG. 20, the ladder-type filter 100 of the fifth embodiment includes one or more series resonators S1 through S3 connected in series on a path 111 connecting between the input terminal Tin and the output terminal Tout. One or more parallel resonators P1 and P2 are connected in parallel between the input terminal Tin and the output terminal Tout. A first end of the parallel resonator P1 is electrically connected to the path 111 between the series resonators S1 and S2, and a second end of the parallel resonator P1 is connected to a ground to be grounded. A first end of the parallel resonator P2 is electrically connected to the path 111 between the series resonators S2 and S3, and a second end of the parallel resonator P2 is connected to a ground to be grounded.

Figure 21A:
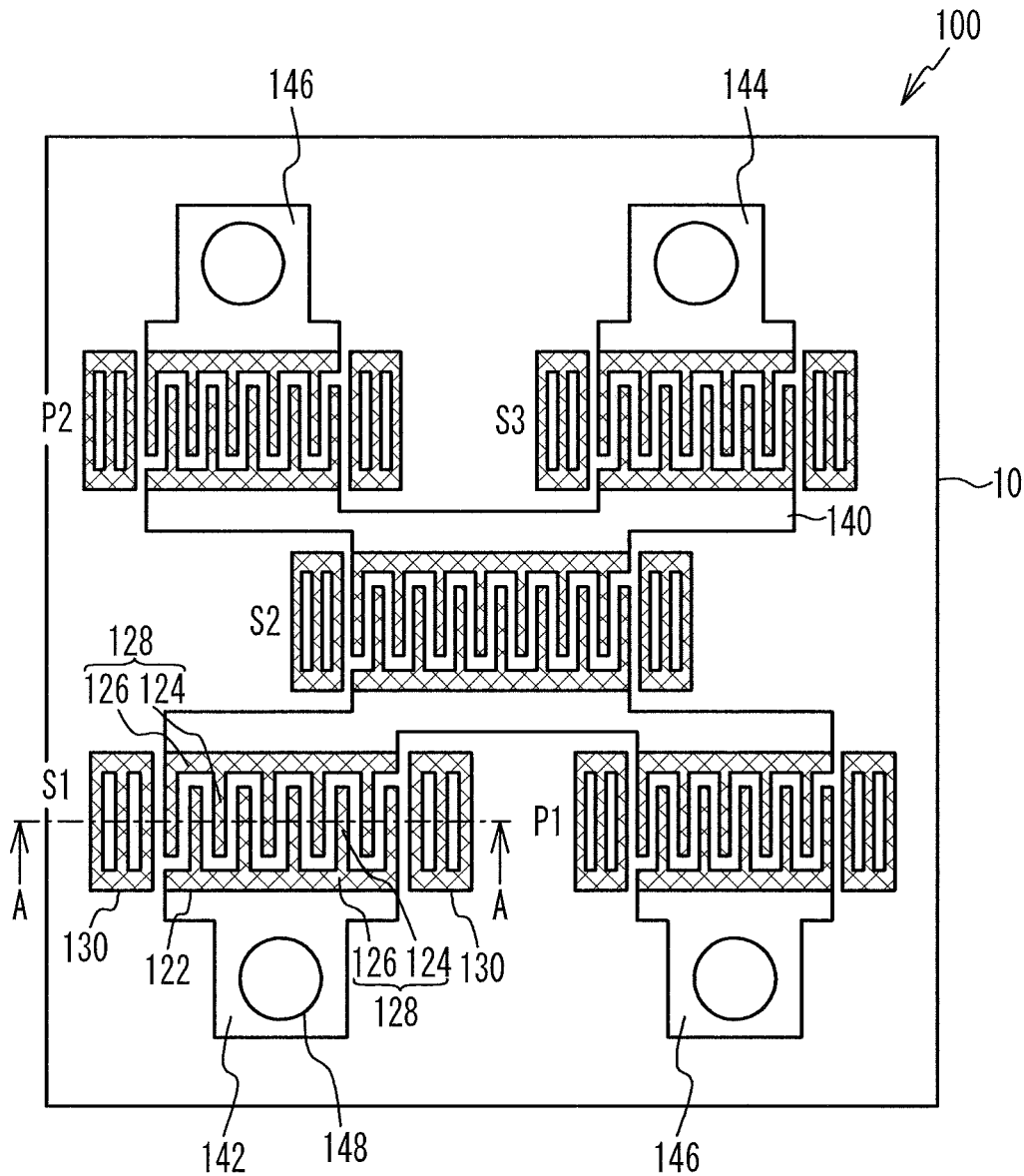
FIG. 21A is a plan view of a ladder-type filter in accordance with a fifth embodiment.
Figure 21B:
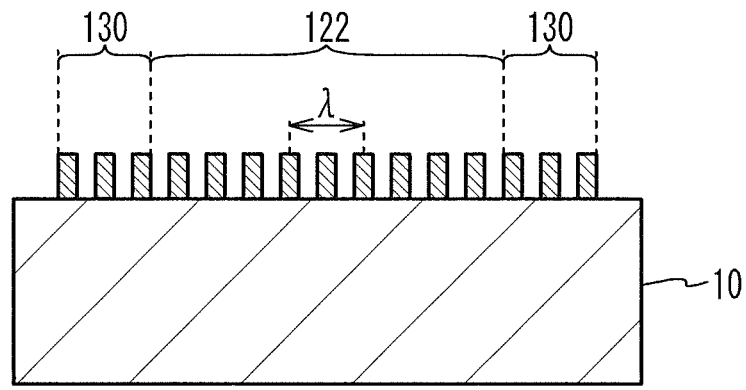
FIG. 21B is a cross-sectional view taken along line A-A in FIG. 21A.

FIG. 21A is a plan view of the ladder-type filter 100 in accordance with the fifth embodiment, and FIG. 21B is a cross-sectional view taken along line A-A in FIG. 21A. As illustrated in FIG. 21A and FIG. 21B, the series resonators S1 through S3 and the parallel resonators P1 and P2 are located on the piezoelectric substrate 10. The series resonators S1 through S3 are connected in series between an input pad 142, which corresponds to the input terminal Tin, and an output pad 144, which corresponds to the output terminal Tout, through wiring lines 140 located on the piezoelectric substrate 10. The wiring line 140 forms the path 111 in FIG. 20. The parallel resonators P1 and P2 are connected in parallel between the input pad 142 and the output pad 144 through the wiring lines 140 located on the piezoelectric substrate 10. The parallel resonator P1 is connected between the wiring line 140, which connects between the series resonators S1 and S2, and ground pads 146. The parallel resonator P2 is connected between the wiring line 140, which connects between the series resonators S2 and S3, and the ground pad 146. Bumps 148 are located on the input pad 142, the output pad 144, and the ground pads 146.

The piezoelectric substrate 10 is, for example, a lithium tantalate substrate, but may be a lithium niobate substrate. The piezoelectric substrate 10 may be bonded on a support substrate such as a silicon substrate, a sapphire substrate, an alumina substrate, a polycrystalline spinel substrate, a monocrystalline spinel substrate, a glass substrate, or a crystal substrate. The wiring line 140 is formed of, for example, a metal layer such as a copper layer, an aluminum layer, or a gold layer. The bump 148 is, for example, a gold bump, a solder bump, or a copper bump.

Each of the series resonators S1 through S3 and the parallel resonators P1 and P2 is a surface acoustic wave resonator, and includes an Interdigital Transducer (IDT) 122, which is a pair of comb-shaped electrode fingers, and reflectors 130. The IDT 122 and the reflectors 130 are located on the piezoelectric substrate 10. The IDT 122 includes a pair of comb-shaped electrodes 128 facing each other. The comb-shaped electrode 128 includes electrode fingers 124 and a bus bar 126 connecting the electrode fingers 124. The reflectors 130 are located at the both sides of the IDT 122. The IDT 122 excites a surface acoustic wave on the piezoelectric substrate 10. The reflectors 130 reflect the surface acoustic wave. The pitch λ of the electrode fingers 124 in one comb-shaped electrode 128 corresponds to the wavelength of the surface acoustic wave excited by the IDT 122. An insulating film such as a silicon oxide film or a silicon nitride film may be located so as to cover the IDT 122 and the reflectors 130. The film thickness of the insulating film may be greater than or less than the film thicknesses of the IDT 122 and the reflectors 130.

The IDT 122 and the reflectors 130 of the series resonator S1 are formed of a multilayer having a metal layer mainly composed of titanium (Ti) and another metal layer located on the metal layer and mainly composed of aluminum (Al). The metal layer mainly composed of Ti is provided as an adhesion layer, and the characteristics of the surface acoustic wave excited by the IDT 122 is determined by the metal layer mainly composed of Al. The IDTs 122 and the reflectors 130 of the series resonators S2 and S3 and the parallel resonators P1 and P2 are formed of a metal layer mainly composed of molybdenum (Mo). The IDT 122 and the reflectors 130 have film thicknesses of, for example, approximately 0.1λ.

Table 7 lists examples of the pitch, the number of pairs, the aperture length, the electrode material, the film thickness, and the acoustic velocity of the surface acoustic wave of each of the series resonators S1 through S3 and the parallel resonators P1 and P2.

TABLE 7

| Resonator | Pitch [μm] | Number of pairs | Aperture length [μm] | Electrode material | Film thickness [nm] | Acoustic velocity of a surface acoustic wave [m/sec] |
| --- | --- | --- | --- | --- | --- | --- |
| S1 | 5.37 | 50 | 20λ | Al/Ti | 260/200 | 3900 |
| S2 | 4.15 | 65 | 30λ | Mo | 490 | 3100 |
| S3 | 4.21 | 45 | 40λ | Mo | 490 | 3100 |
| P1 | 4.46 | 95 | 30λ | Mo | 490 | 3100 |
| P2 | 4.43 | 75 | 35λ | Mo | 490 | 3100 |

Here, a ladder-type filter in accordance with a second comparative example will be described. In the ladder-type filter of the second comparative example, the IDTs 122 and the reflectors 130 are formed of a metal layer mainly composed of Mo in all the series resonators S1 through S3 and the parallel resonators P1 and P2. Other structures are the same as those of the ladder-type filter of the fifth embodiment.

In the second comparative example, the reason why the IDTs 122 and the reflectors 130 in all the series resonators S1 through S3 and the parallel resonators P1 and P2 are formed of a metal layer mainly composed of Mo is as follows.

When the acoustic velocity of the surface acoustic wave excited by the IDT 122 is higher than the acoustic velocity of a bulk wave propagating through the piezoelectric substrate 10 (for example, the slowest lateral bulk wave), the surface acoustic wave propagates through the surface of the piezoelectric substrate 10 while emitting a bulk wave. Thus, loss is generated. In particular, the acoustic velocity of the Shear Horizontal (SH) wave, which is a type of surface acoustic wave, is higher than the acoustic velocity of the bulk wave. Thus, the surface acoustic wave resonator using the SH wave as a primary mode has large loss. For example, in a Y-cut X-propagation lithium tantalate substrate having a cut angle of 20° or greater and 48° or less, the SH wave is a primary mode.

To reduce the loss, the acoustic velocity of the surface acoustic wave excited by the IDT 122 is preferably lower than the acoustic velocity of the bulk wave propagating through the piezoelectric substrate 10. To reduce the acoustic velocity of the surface acoustic wave, a metal having high acoustic impedance is used for the IDT 122 and the reflectors 130. The acoustic impedance Z is expressed by $$Z = \sqrt{\frac{(\rho \times E)}{2 \times (1 + Pr)}} \quad (4)$$

where the density is represented by ρ, the Young's modulus is represented by E, and the Poisson ratio is represented by Pr.

Since Mo has a density of 10.2 g/cm$^3$, a Young's modulus of 329 GPa, and a Poisson ratio of 0.31, the acoustic impedance of Mo is 35.9 GPa·s/m. For example, when the IDT 122 and the reflectors 130 are formed of a metal layer mainly composed of Al, since Al has a density of 2.70 g/cm$^3$, a Young's modulus of 68 GPa, and a Poisson ratio of 0.34, the acoustic impedance of Al is 8.3 GPa·s/m.

Therefore, in the second comparative example, to make the acoustic velocity of the surface acoustic wave low to reduce the loss, the IDTs 122 and the reflectors 130 of all the series resonators S1 through S3 and the parallel resonators P1 and P2 are formed of a metal layer mainly composed of Mo having high acoustic impedance. However, in the surface acoustic wave resonator in which the IDTs 122 and the reflector 130 are made of a heavy metal (a metal having a large density) such as Mo, lateral-mode spurious is generated.

Figure 22:
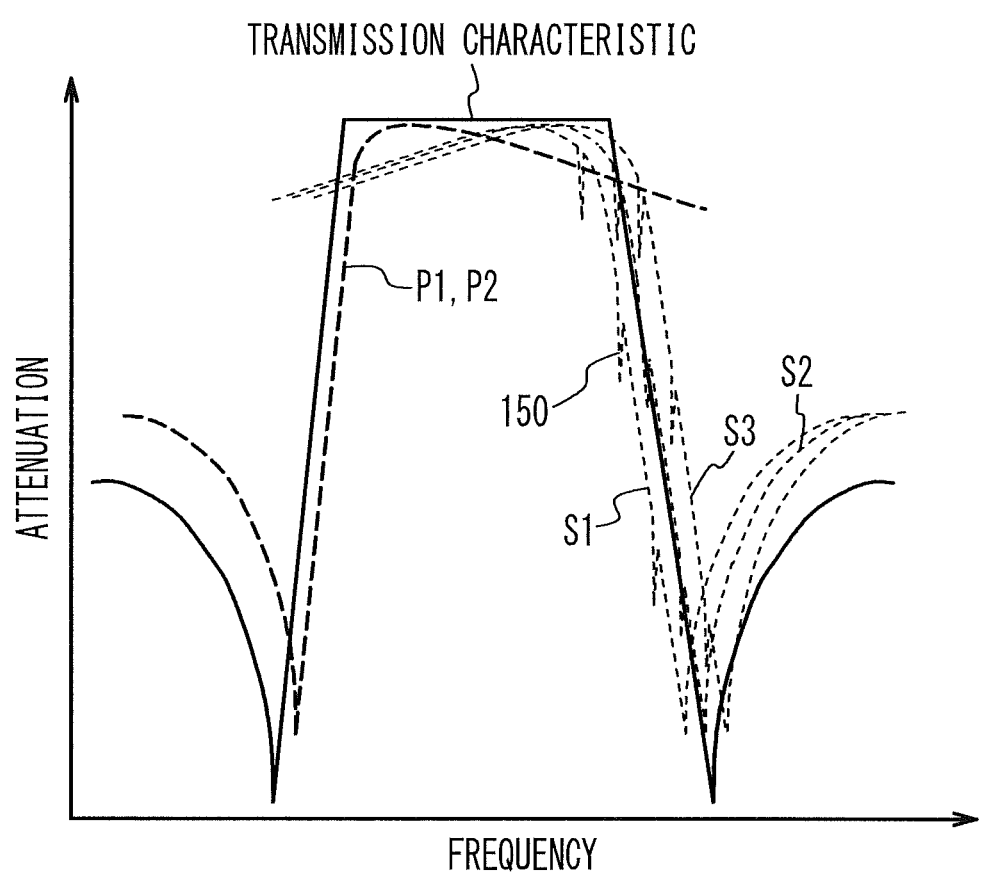
FIG. 22 illustrates the transmission characteristic of a ladder-type filter in accordance with a second comparative example and the frequency characteristics of series resonators and parallel resonators in accordance with the second comparative example.

FIG. 22 illustrates the transmission characteristic of the ladder-type filter, and the frequency characteristics of the series resonators and the parallel resonators of the second comparative example. The transmission characteristic of the ladder-type filter is indicated by a solid line, the frequency characteristics of the series resonators S1 through S3 are indicated by dotted lines, and the frequency characteristics of the parallel resonators P1 and P2 are indicated by a dashed line. As illustrated in FIG. 22, the transmission characteristic of the ladder-type filter at the high frequency side is formed by the series resonators S1 through S3, and the transmission characteristic of the ladder-type filter at the low frequency side is formed by the parallel resonators P1 and P2. The resonant frequencies of the series resonators S1 through S3 may be slightly different from each other to widen the attenuation band at the high frequency side of the ladder-type filter. For example, the resonant frequency increases in the order of the series resonators S1, S2, and S3. In addition, in the series resonators S1 through S3, the IDT 122 is made of Mo, which is a heavy metal, so that the acoustic velocity of the surface acoustic wave excited by the IDT 122 is lower than the acoustic velocity of the bulk wave propagating through the piezoelectric substrate 10. When the IDT 122 is made of a heavy material such as Mo, the absolute value of the anisotropy coefficient becomes large, and lateral-mode spurious 150 is generated. The lateral-mode spurious 150 is generated between the resonant frequency and the antiresonant frequency. The generation of the lateral-mode spurious 150 generates ripple (not illustrated) in the passband of the ladder-type filter. The case where the resonant frequencies of the parallel resonators P1 and P2 are approximately the same is described as an example, but as in the series resonators S1 through S3, the resonant frequencies may be slightly different to widen the attenuation band at the low frequency side. In addition, as in the parallel resonators P1 and P2, the resonant frequencies of the series resonators S1 through S3 may be approximately the same. Although lateral-mode spurious is also generated in the parallel resonators P1 and P2, the illustration is omitted here to clarify the figure.

Figure 23A:
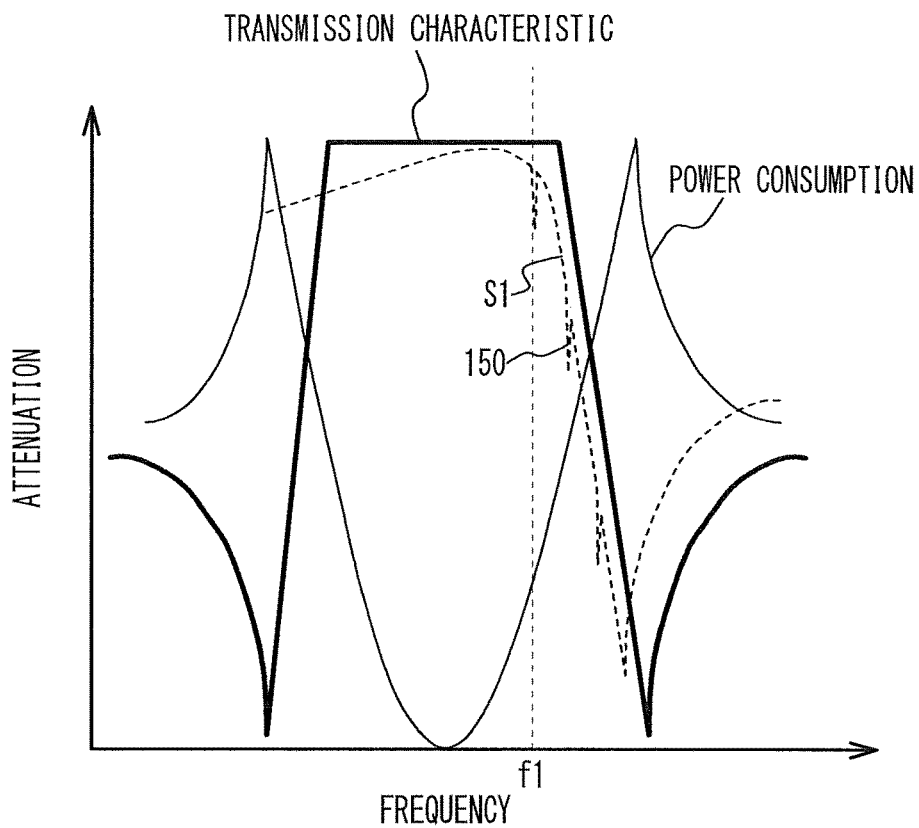
FIG. 23A and FIG. 23B are diagrams for describing problems that arise in the ladder-type filter in accordance with the second comparative example.
Figure 23B:
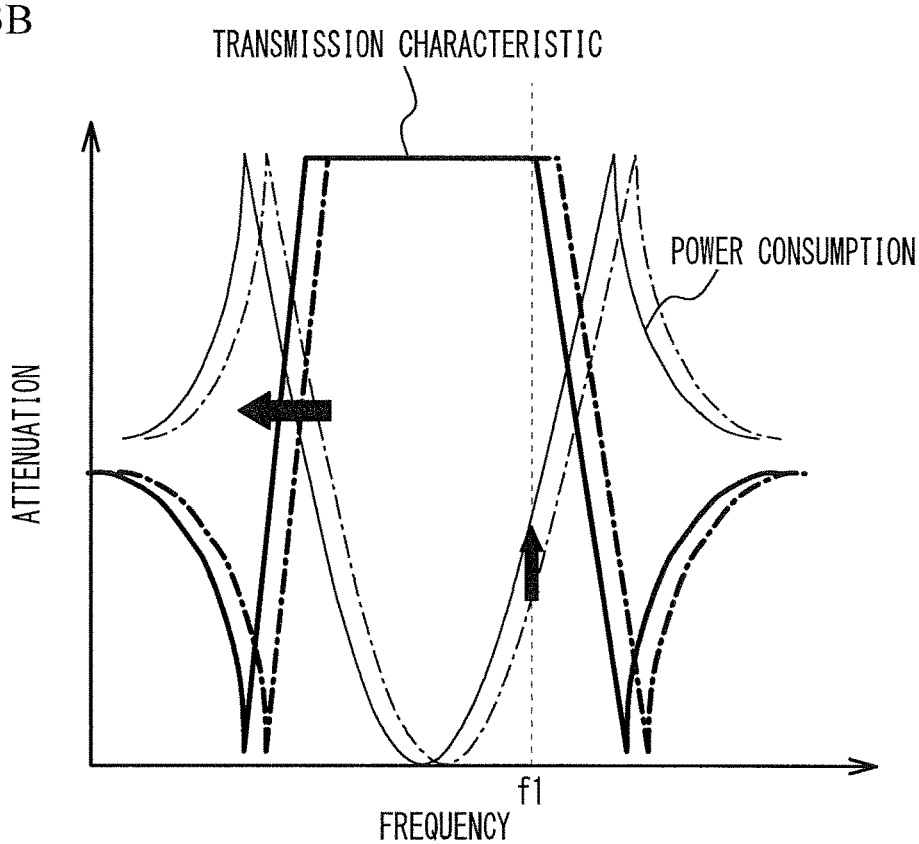

FIG. 23A and FIG. 23B are diagrams for describing the problem arising in the ladder-type filter in accordance with the second comparative example. In FIG. 23A and FIG. 23B, the transmission characteristic of the ladder-type filter is indicated by a bold solid line, and the power consumption of the ladder-type filter is indicated by a thin solid line. In FIG. 23A, the frequency characteristic of the series resonator S1 is indicated by a dotted line. As illustrated in FIG. 23A, the power consumption of the ladder-type filter is minimum near the center in the passband, and is maximum near the attenuation pole. The range from the resonant frequency to the antiresonant frequency of the series resonator S1 is present in the passband of the ladder-type filter, and the series resonator S1 forms the transmission characteristic at the high frequency side. Thus, when the lateral-mode spurious 150 is being generated in the series resonator S1 and a high-frequency signal with a large electric power is applied to the ladder-type filter, the series resonator S1 is likely to generate a lot of heat. For example, when a high-frequency signal having a frequency f1, which is at the high frequency side in the passband, is applied and the lateral-mode spurious 150 is being generated at the frequency f1, the series resonator S1 is likely to generate a lot of heat. The heat generation by the series resonator S1 increases the temperature of the ladder-type filter, and shifts the transmission characteristic and the power consumption to the lower frequency as illustrated in FIG. 23B. For example, when the piezoelectric substrate 10 is a lithium tantalate substrate or a lithium niobate substrate, the transmission characteristic and the power consumption are likely to shift to the lower frequency. In FIG. 23B, the transmission characteristic before shift and the power consumption before shift are indicated by chain lines, and the transmission characteristic and the power consumption after shift are indicated by solid lines. Thus, when a high-frequency signal having a frequency f1 is applied to the ladder-type filter, the power consumption of the ladder-type filter increases, and the series resonator S1 is more likely to generate heat. This may result in damage (for example, meltdown) of the IDT 122 of the series resonator S1. As described above, the ladder-type filter of the second comparative example has insufficient power durability.

As illustrated in FIG. 23B, at the low frequency side in the passband, as the temperature of the ladder-type filter increases, the power consumption decreases. Thus, generated heat in the parallel resonators P1 and P2, which form the transmission characteristic of the ladder-type filter at the low frequency side, is unlikely to become large, and thus, the IDT 122 is unlikely to be damaged.

Figure 24:
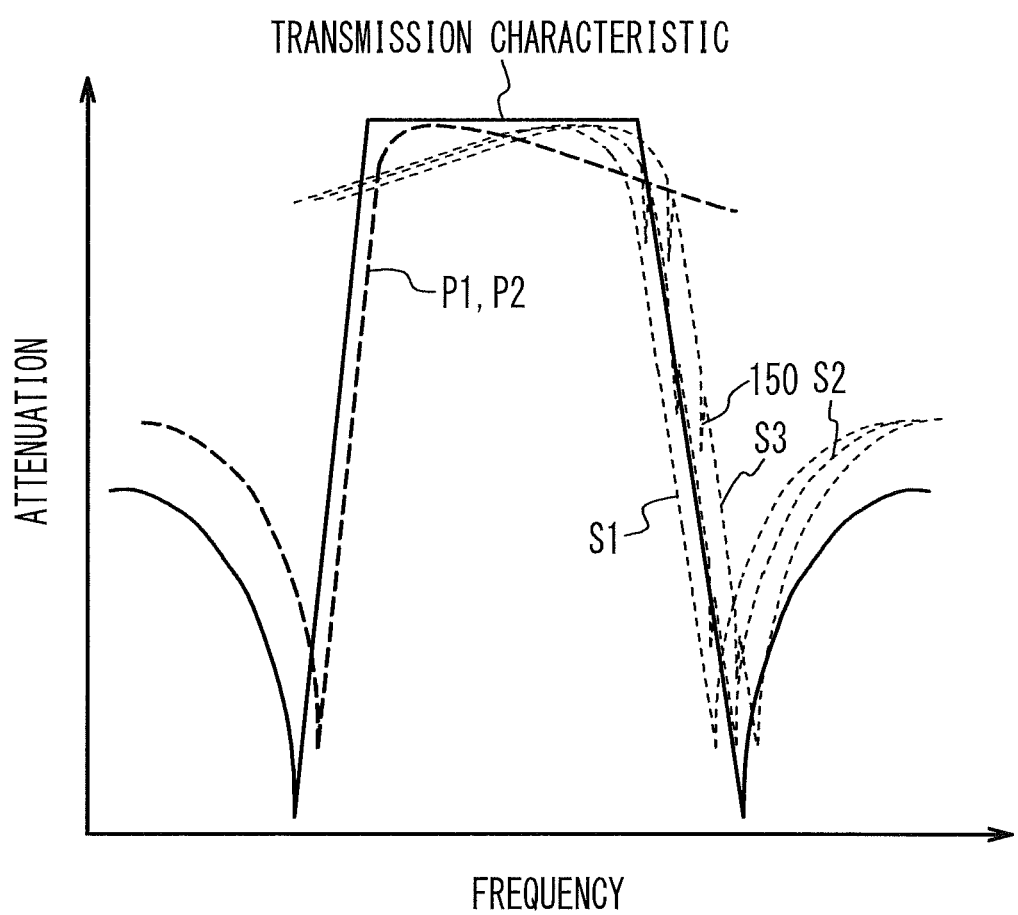
FIG. 24 illustrates the transmission characteristic of the ladder-type filter in accordance with the fifth embodiment and the frequency characteristics of series resonators and parallel resonators in accordance with the fifth embodiment.

FIG. 24 illustrates the transmission characteristic of the ladder-type filter 100, and the frequency characteristics of the series resonators and the parallel resonators in accordance with the fifth embodiment. The transmission characteristic of the ladder-type filter is indicated by a solid line, the frequency characteristics of the series resonators S1 through S3 are indicated by dotted lines, and the frequency characteristics of the parallel resonators P1 and P2 are indicated by a dashed line. As illustrated in FIG. 24, in the fifth embodiment, the lateral-mode spurious 150 is reduced in the series resonator S1. This is because the IDT 122 is made of a metal mainly composed of Al, which is a lightweight metal, to make the acoustic velocity of the surface acoustic wave excited by the IDT 122 higher than the acoustic velocity of the bulk wave propagating through the piezoelectric substrate 10 in the series resonator S1. When the IDT 122 is made of a lightweight metal such as Al, the absolute value of the anisotropy coefficient becomes small, and as a result, the lateral-mode spurious 150 is reduced. For example, when the piezoelectric substrate 10 is a Y-cut X-propagation lithium tantalate substrate and the IDT 122 is made of a heavy metal such as Mo, the anisotropy coefficient is positive, and the absolute value is large, while when the IDT 122 is made of a lightweight metal such as Al, the absolute value of the anisotropy coefficient is small. As described above, since the lateral-mode spurious 150 in the series resonator S1 is reduced in the fifth embodiment, even when a high-frequency signal with a large electric power is applied to the series resonator S1, the heat generated in the series resonator S1 is reduced, and the IDT 122 is thereby inhibited from being damaged.

To reduce the loss, the acoustic velocity of the surface acoustic wave excited by the series resonators S2 and S3 is made to be low, and to reduce lateral-mode spurious, the acoustic velocity of the surface acoustic wave excited by the series resonator S1 is made to be higher than the acoustic velocity of the surface acoustic wave excited by the series resonators S2 and S3. When the electrode fingers of the comb-shaped electrodes 128 constituting the IDTs 122 in the series resonators S1 through S3 have the same average pitch λ and the acoustic velocity of the surface acoustic wave excited by the series resonator S1 is higher than the acoustic velocity of the surface acoustic wave excited by the series resonators S2 and S3, the resonant frequency of the series resonator S1 is higher than the resonant frequency of the series resonators S2 and S3. However, the IDT 122 is likely to be damaged in the series resonator having a low resonant frequency among the series resonators. Thus, the average pitch λ of the electrode fingers 124 of the comb-shaped electrodes 128 constituting the IDT 122 of the series resonator S1 is made to be greater than the average pitch λ of the electrode fingers 124 of the comb-shaped electrodes 128 constituting the IDTs 122 of the series resonators S2 and S3 to make the resonant frequency of the series resonator S1 approximately equal to or less than the resonant frequencies of the series resonators S2 and S3. The average pitch λ of the electrode fingers 124 is the value obtained by averaging all the pitches A of the electrode fingers 124 of the IDT 122, and may be, for example, a value obtained by dividing the width of the IDT 122 in the propagation direction of the surface acoustic wave by the number of pairs of the electrode fingers 124.

As described above, in the fifth embodiment, the series resonator S1 includes the IDT 122 of which the average pitch λ is greater than the average pitches λ of the IDTs 122 of the series resonators S2 and S3 and that excites the surface acoustic wave having a higher acoustic velocity than the surface acoustic wave excited by the IDTs 122 of the series resonators S2 and S3. Accordingly, the lateral-mode spurious 150 in the series resonator S1 is reduced. Therefore, even when a high-frequency signal with a large electric power is applied to the ladder-type filter 100, the heat generation in the series resonator S1 is reduced, and the IDT 122 of the series resonator S1 is inhibited from being damaged. Thus, the power durability is improved. The average pitch λ of the electrode fingers 124 of the IDT 122 of the series resonator S1 is preferably 1.1 times or more of, more preferably 1.2 times or more of the average pitches λ of the electrode fingers 124 of the IDTs 122 of the series resonators S2 and S3.

In addition, in the fifth embodiment, the series resonator S1 has a lower resonant frequency than the series resonators S2 and S3, and has the IDT 122 that excites the surface acoustic wave having a higher acoustic velocity than the surface acoustic waves excited by the IDTs 122 of the series resonators S2 and S3. This configuration reduces the lateral-mode spurious 150 of the series resonator S1, thus improving the power durability.

The acoustic impedance of the IDT 122 of the series resonator S1 is less than the acoustic impedance of the IDTs 122 of the series resonators S2 and S3. This configuration reduces the lateral-mode spurious in the series resonator S1 and reduces the loss of the ladder-type filter 100. The acoustic impedance of the IDT 122 of the series resonator S1 is preferably one-half of the acoustic impedance of the IDT 122 of the series resonator S2 or less, more preferably one-third of the acoustic impedance of the IDT 122 of the series resonator S2 or less.

The series resonator S1 is preferably the series resonator having the smallest resonant frequency among the series resonators S1 through S3. The series resonator having the smallest resonant frequency has its resonant frequency within the passband of the ladder-type filter and forms the transmission characteristic at the high frequency side, thus being likely to be applied with a large electric power. Thus, when lateral-mode spurious is generated in the series resonator having the smallest resonant frequency, a large amount of heat is generated, and thereby the IDT is easily damaged. Thus, when the series resonator S1 has the smallest resonant frequency among the series resonators S1 through S3, the lateral-mode spurious 150 in the series resonator S1 is preferably reduced.

As illustrated in FIG. 20, the series resonator S1 is preferably the series resonator closest to the input terminal Tin among the series resonators S1 through S3. The series resonator located near the input terminal is more likely to be applied with a large electric power than other series resonators. Thus, when the series resonator S1 is located closest to the input terminal Tin among the series resonators S1 through S3, the lateral-mode spurious 150 in the series resonator S1 is preferably reduced.

In the expression (4), since the Poisson ratio is not large in metal materials, the metal having high acoustic impedance is the metal of which density×Young's modulus is large. A metal of larger atomic number has a larger density, and a harder metal has a larger Young's modulus. Such metals are high melting point metals of which the melting point is high. As described above, when the IDT 122 and the reflectors 130 are formed of a high melting point metal, the acoustic velocity of the surface acoustic wave becomes low and the loss is reduced. Table 8 lists the density and the melting point of each of high melting point metals.

TABLE 8

| Metal | Density [g/cm$^3$] | Melting point [° C.] |
|---|---|---|
| Ir | 22.42 | 2454 |
| Mo | 10.22 | 2622 |
| Pt | 21.45 | 1774 |
| Re | 21.02 | 3180 |
| Rh | 12.41 | 1967 |

TABLE 8-continued

| Metal | Density [g/cm³] | Melting point [° C.] |
|---|---|---|
| Ru | 12.19 | 2427 |
| Ta | 16.69 | 3017 |
| W | 19.30 | 3382 |

As presented in Table 8, the melting points of iridium (Ir), Mo, platinum (Pt), rhenium (Re), rhodium (Rh), ruthenium (Ru), tantalum (Ta), and tungsten (W) are higher than the melting point of Al (660° C.). The densities are four times or more of the density of Al (2.70 g/cm³). Therefore, the IDTs 122 and the reflectors 130 of the series resonators S2 and S3 and the parallel resonators P1 and P2 preferably include a metal layer mainly composed of at least one of Ir, Mo, Pt, Re, Rh, Ru, Ta, and W. This configuration makes the acoustic velocities of the surface acoustic waves excited by the IDTs 122 of the series resonators S2 and S3 and the parallel resonators P1 and P2 lower than the acoustic velocity of the bulk wave propagating through the piezoelectric substrate 10, thus reducing the loss.

As described above, Al is a metal that has low acoustic impedance and is lightweight. Therefore, the IDT 122 and the reflectors 130 of the series resonator S1 preferably include a metal layer mainly composed of Al so that the lateral-mode spurious is reduced.

The term "the IDT 122 and the reflectors 130 include a metal layer mainly composed of a certain metal" means that the metal layer contains the certain metal to the extent that the acoustic velocity of the surface acoustic wave is lower than the acoustic velocity of the bulk wave propagating through the piezoelectric substrate 10 or is that the metal layer contains the certain metal to the extent that the lateral-mode spurious is reduced. For example, the IDT 122 and the reflectors 130 include a metal layer of which the atomic concentration of the certain metal is 50% or greater, preferably 80% or greater, more preferably 90% or greater.

Sixth Embodiment

Figure 25A:
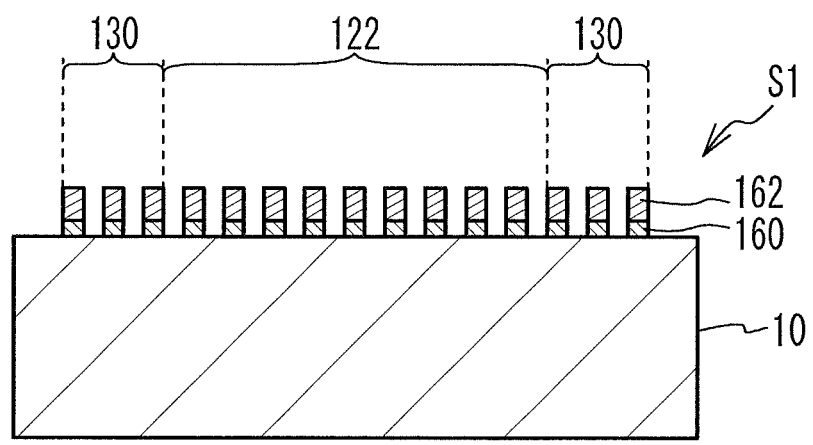
FIG. 25A is a cross-sectional view of a series resonator S1 in a sixth embodiment.
Figure 25B:
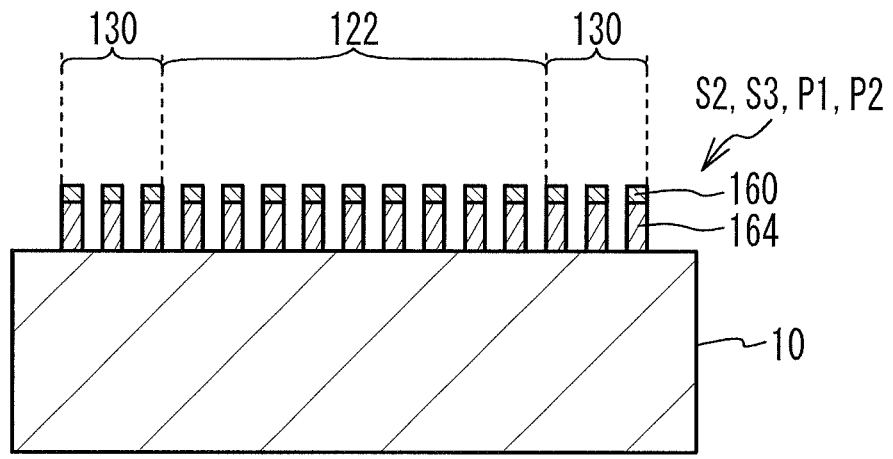
FIG. 25B is a cross-sectional view of series resonators S2 and S3 and parallel resonators P1 and P2 in the sixth embodiment.

The circuit diagram and the plan view of a ladder-type filter in accordance with a sixth embodiment are the same as FIG. 20 and FIG. 21A, respectively, and the illustration and the description thereof are thus omitted. FIG. 25A is a cross-sectional view of the series resonator S1 in the sixth embodiment, and FIG. 25B is a cross-sectional view of the series resonators S2 and S3 and the parallel resonators P1 and P2 in the sixth embodiment. As illustrated in FIG. 25A, in the series resonator S1 in the sixth embodiment, the IDT 122 and the reflectors 130 are formed of a multilayer including a metal layer 160 mainly composed of Ti and a metal layer 162 located on the metal layer 160 and mainly composed of Al. As illustrated in FIG. 25B, in the series resonators S2 and S3 and the parallel resonators P1 and P2 in the sixth embodiment, the IDTs 122 and the reflectors 130 are formed of a multilayer including a metal layer 164 mainly composed of Mo and the metal layer 160 located on the metal layer 164 and mainly composed of Ti. The metal layer 160 in the series resonator S1 and the metal layer 160 in the series resonators S2 and S3 and the parallel resonators P1 and P2 have approximately identical film thicknesses.

Figure 26A:
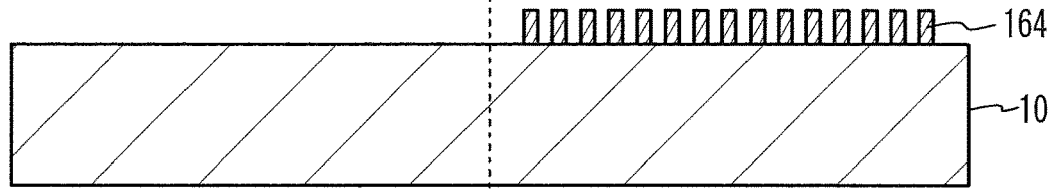
FIG. 26A through FIG. 26E are cross-sectional views illustrating a method of fabricating the series resonators S1 through S3 and the parallel resonators P1 and P2 in the sixth embodiment.

FIG. 26A through FIG. 26E are cross-sectional views illustrating a method of fabricating the series resonators S1 through S3 and the parallel resonators P1 and P2 in the sixth embodiment. As illustrated in FIG. 26A, a metal film mainly composed of Mo is formed on the piezoelectric substrate 10 by vacuum evaporation, ion assisted evaporation, or sputtering, and is then subjected to dry etching or wet etching using patterned photoresist. This process forms the metal layer 164 mainly composed of Mo and constituting the IDTs 122 and the reflectors 130 of the series resonators S2 and S3 and the parallel resonators P1 and P2.

Figure 26B:
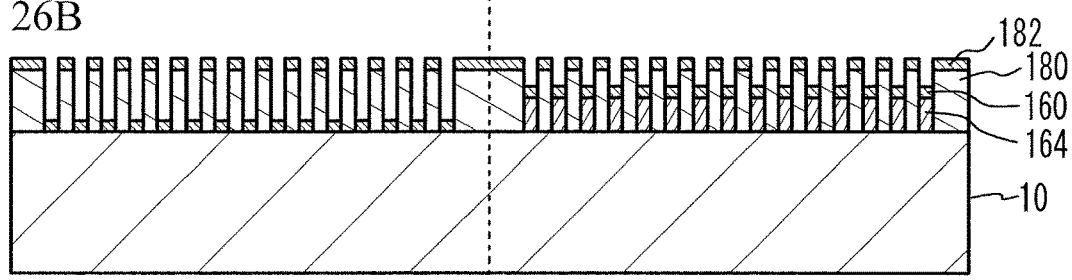

As illustrated in FIG. 26B, a photoresist 180 having apertures in regions in which the IDT 122 and the reflectors 130 of the series resonators S1 through S3 and the parallel resonators P1 and P2 are to be formed is formed on the piezoelectric substrate 10. Thereafter, a metal film 182 mainly composed of Ti is formed so as to be embedded in the apertures of the photoresist 180 by vacuum evaporation, ion assisted evaporation, or sputtering.

Figure 26C:
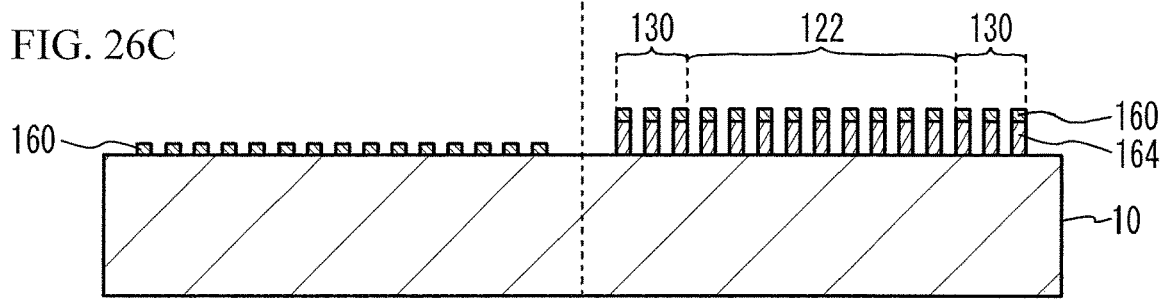

As illustrated in FIG. 26C, the photoresist 180 is removed by liftoff. This process forms the metal layer 160 mainly composed of Ti and constituting the IDTs 122 and the reflectors 130 of the series resonator S1. In the series resonators S2 and S3 and the parallel resonators P1 and P2, the metal layer 160 mainly composed of Ti is formed on the metal layer 164 to form the IDTs 122 and the reflectors 130.

Figure 26D:
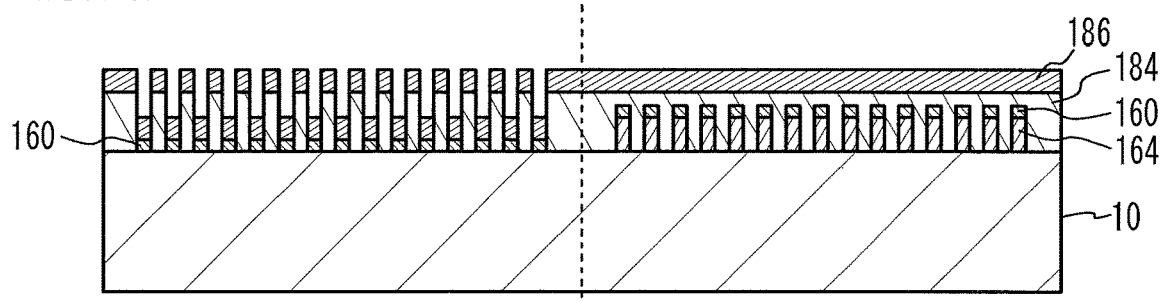

As illustrated in FIG. 26D, a photoresist 184 having apertures in regions where the IDT 122 and the reflectors 130 of the series resonator S1 are to be formed is formed on the piezoelectric substrate 10. Thereafter, a metal film 186 mainly composed of Al is formed so as to be embedded in the apertures of the photoresist 184 by vacuum evaporation, ion assisted evaporation, or sputtering.

Figure 26E:
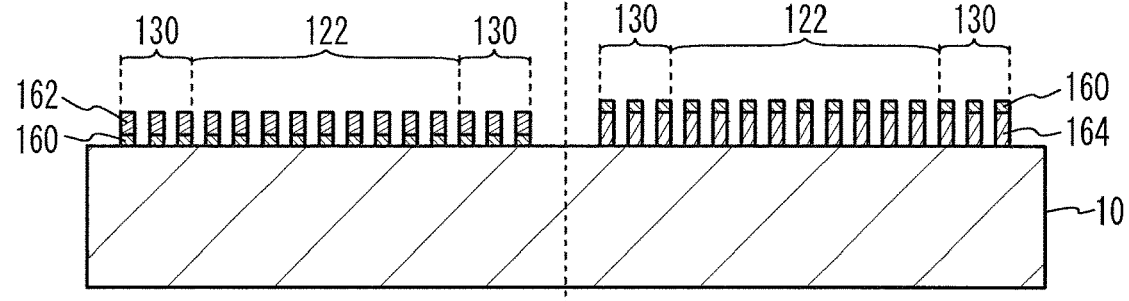

As illustrated in FIG. 26E, the photoresist 184 is removed by liftoff. This process forms the metal layer 162 mainly composed of Al on the metal layer 160 to form the IDT 122 and the reflectors 130 in the series resonator S1.

Figure 27:
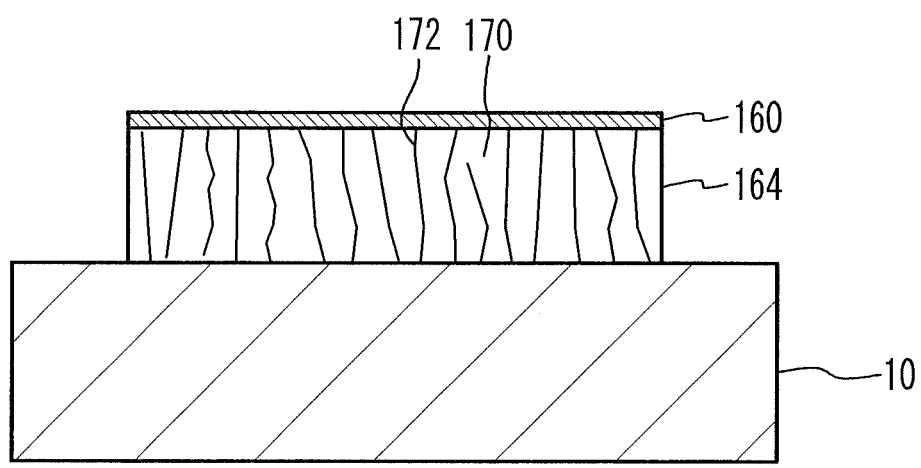
FIG. 27 is a cross-sectional view of the electrode fingers of the series resonators S2 and S3 and the parallel resonators P1 and P2 in the sixth embodiment.

FIG. 27 is a cross-sectional view of the electrode fingers 124 of the series resonators S2 and S3 and the parallel resonators P1 and P2 in the sixth embodiment. In FIG. 27, the electron micrograph of the metal layer 164 is schematically illustrated. As illustrated in FIG. 27, the metal layer 164 has a columnar shape in which a crystal grain 170 extends in the stacking direction, and a grain boundary 172 extends in the stacking direction. That is, the metal layer 164 has a columnar crystal. Such a crystal structure is confirmed by observing the cross-section of the electrode finger 124 by Transmission Electron Microscopy (TEM) or Scanning Electron Microscopy (SEM). The crystal grain having a columnar shape is a crystal grain of which the longitudinal direction corresponds to the stacking direction when the cross-section of the electrode finger 124 is observed by TEM or SEM. The metal layer 164 has crystal grains having a columnar shape of which the longitudinal direction corresponds to the stacking direction, the ratio of the number of crystal grains having a columnar shape to the number of crystal grains of which the outer shape was identified when the cross-section of the electrode finger 124 was observed by TEM or SEM is 50% or greater. Furthermore, the metal layer 164 preferably has crystal grains having a columnar shape of which the longitudinal direction corresponds to the stacking direction and that occupies 80% or more of the crystal grains of which the outer shape was identified. The metal layer 160 mainly composed of Ti is located on the metal layer 164 that has a columnar crystal.

It is known that when a metal layer mainly composed of Pt is formed on the piezoelectric substrate 10, this metal layer has a columnar crystal. From this fact, it is considered that at least a metal having a higher melting point than Pt is likely to form a columnar crystal. As presented in Table 8, since Pt has a melting point of 1774° C., it is considered that a high melting point metal of which the melting point is 1774° C. or greater is likely to form a columnar crystal. Thus, it is considered that a metal layer mainly composed of Ir, Mo, Pt, Re, Rh, Ru, Ta, and W is likely to have a columnar crystal.

As described in the fifth embodiment, in the series resonators S2 and S3 and the parallel resonators P1 and P2, the IDT 122 and the reflectors 130 are formed so as to include the metal layer 164 mainly composed of a high melting point metal to make the acoustic velocity of the surface acoustic wave excited by the IDT 122 lower than the acoustic velocity of the bulk wave propagating through the piezoelectric substrate 10. In this case, the metal layer 164 has a columnar crystal. In the columnar crystal, the grain boundary 172 is well-defined. This is because the bond between the crystal grains 170 is weak and/or there is a gap between the crystal grains 170. In addition, the sizes of the crystal grains 170 are uniform, and the crystal grains 170 are continuous in the stacking direction of the metal layer 164.

When a high-frequency signal with a large electric power is applied to the series resonators S2 and S3, the surface acoustic wave greatly oscillates the electrode finger 124, and thereby a stress is applied to the electrode finger 124. When the series resonators S2 and S3 are formed of only the metal layer 164, since the metal layer 164 has a columnar crystal, the electrode finger 124 may crack along the grain boundary 172.

On the other hand, in the sixth embodiment, the IDTs 122 of the series resonators S2 and S3 have the metal layer 164 having the columnar crystal grain 170 and the metal layer 160 located on the metal layer 164. The metal layer 160 located on the metal layer 164 is formed of the same metal as the metal layer 160 that is located closer to the piezoelectric substrate 10 of the metal layers 160 and 162 forming the IDT 122 of the series resonator S1. As described above, since the metal layer 160 is located on the metal layer 164 having the crystal grain 170 having a columnar shape, even when a high-frequency signal with a large electric power is input to the series resonators S2 and S3, the electrode finger 124 is inhibited from being damaged along the grain boundary 172 of the metal layer 164. In addition, when the metal layer 160 formed on the metal layer 164 is made of the same metal as the metal layer 160 forming the IDT 122 of the series resonator S1, increase in the number of fabrication steps is reduced.

In the sixth embodiment, the metal layer 164 included in the IDTs 122 and the reflectors 130 of the series resonators S2 and S3 and the parallel resonators P1 and P2 may have a structure having a region having a columnar crystal and a region that is located closer to the piezoelectric substrate 10 than the region having a columnar crystal and/or at an opposite side of the region having a columnar crystal from the piezoelectric substrate 10 and has an amorphous structure.

Figure 28:
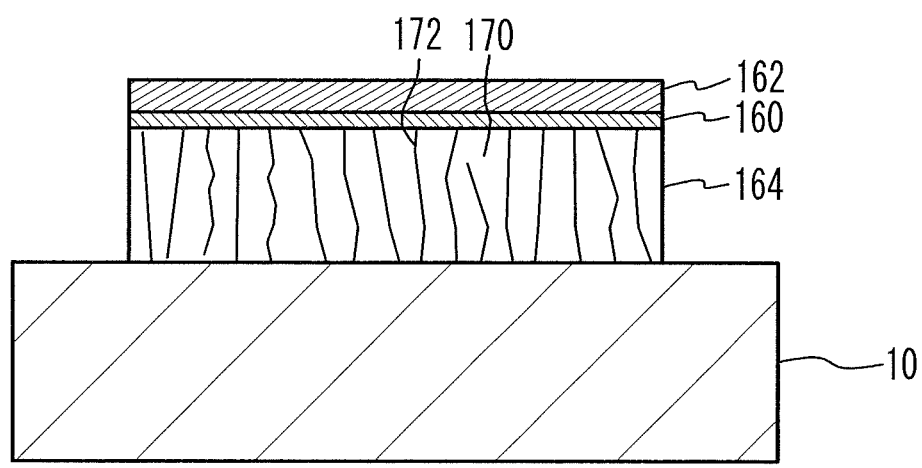
FIG. 28 is a cross-sectional view of the electrode fingers of the series resonators S2 and S3 and the parallel resonators P1 and P2 in a first variation of the sixth embodiment.

FIG. 28 is a cross-sectional view of the electrode fingers 124 of the series resonators S2 and S3 and the parallel resonators P1 and P2 of a first variation of the sixth embodiment. In FIG. 28, as in FIG. 27, the electron micrograph of the metal layer 164 is schematically illustrated. As illustrated in FIG. 28, in the first variation of the sixth embodiment, the metal layer 160 and the metal layer 162 are located on the metal layer 164 in this order.

As in the first variation of the sixth embodiment, in the series resonators S2 and S3 and the parallel resonators P1 and P2, the metal layers 160 and 162 made of the same material as all the metal layers 160 and 162 of the IDT 122 of the series resonator S1 may be located on the metal layer 164. In this case, breakage of the electrode finger 124 is more effectively inhibited.

As in the sixth embodiment and the first variation of the sixth embodiment, it is sufficient if a metal layer formed of the same material as at least one of the metal layers forming the IDT 122 of the series resonator S1 is located on the metal layer 164 having the crystal grain 170 having a columnar shape in the series resonators S2 and S3 and the parallel resonators P1 and P2.

Figure 29:
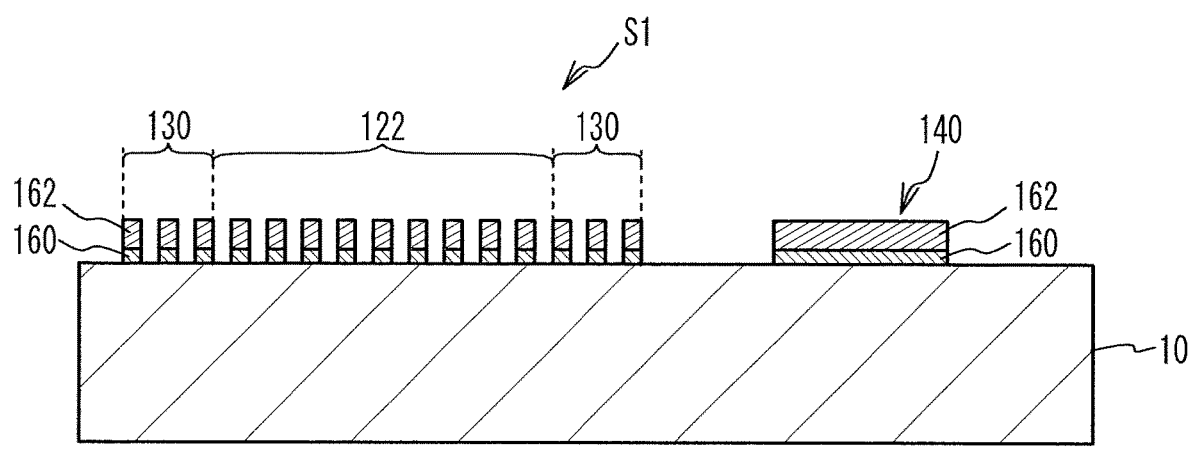
FIG. 29 is a cross-sectional view of the series resonator S1 and a wiring line in the sixth embodiment.

FIG. 29 is a cross-sectional view of the series resonator S1 and the wiring line 140 in the sixth embodiment. As illustrated in FIG. 29, the wiring line 140 is formed of a multilayer including the metal layer 160 mainly composed of Ti and the metal layer 162 located on the metal layer 160 and mainly composed of Al. That is, the wiring line 140 has the same film structure as the IDT 122 and the reflectors 130 of the series resonator S1. Since the wiring line 140 is formed at the same time as the IDT 122 and the reflectors 130 of the series resonator S1, the thickness of each layer of the wiring line 140 is approximately equal to the thickness of the corresponding layer of the IDT 122 and the reflectors 130 of the series resonator S1. As described above, when the film structure of the IDT 122 and the reflectors 130 of the series resonator S1 is the same as that of the wiring line 140, the IDT 122 and the reflectors 130 of the series resonator S1 and the wiring line 140 can be formed at the same time, and the increase in the number of fabrication steps is thus reduced.

Seventh Embodiment

Figure 30:
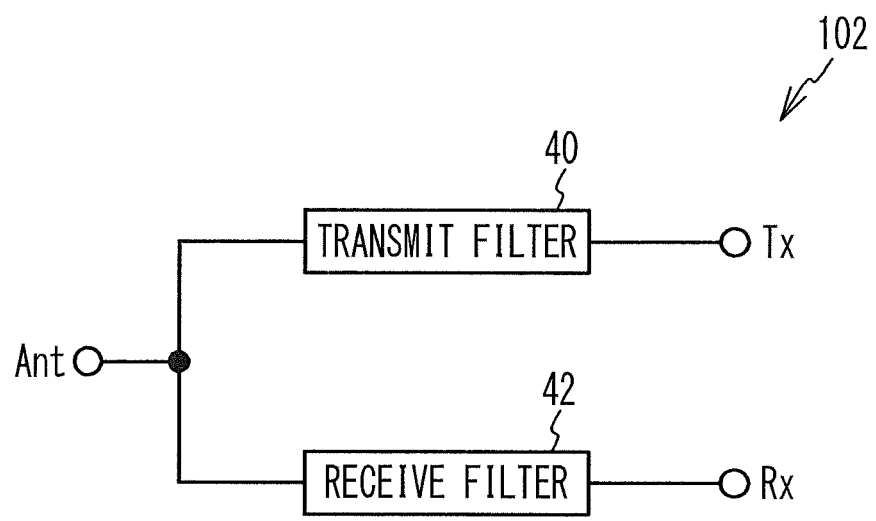
FIG. 30 is a circuit diagram of a duplexer in accordance with a seventh embodiment.

FIG. 30 is a circuit diagram of a duplexer 102 in accordance with a seventh embodiment. As illustrated in FIG. 30, the duplexer 102 of the seventh embodiment includes the transmit filter 40 connected between the common terminal Ant and the transmit terminal Tx. The receive filter 42 is connected between the common terminal Ant and the receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 can be the ladder-type filter of the fifth embodiment or the sixth embodiment.

The seventh embodiment describes a duplexer as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric substrate; and
a pair of comb-shaped electrodes that is located on the piezoelectric substrate, includes a metal film, and excites a surface acoustic wave, the metal film being mainly composed of a metal having a melting point equal to or higher than a melting point of Pt, the metal film having a first region in which a crystal grain has a columnar shape and a second region that is located on and/or under the first region in a stacking direction and has less crystallinity than the first region or has an amorphous structure.

2. The acoustic wave device according to claim 1, wherein when a cross-section is observed with an electron microscope, a ratio of a number of crystal grains having a columnar shape to a number of crystal grains in the first region is 50% or greater.

3. The acoustic wave device according to claim 1, wherein the second region is located between the first region and the piezoelectric substrate.

4. The acoustic wave device according to claim 3, wherein the second region is in contact with the piezoelectric substrate.

5. The acoustic wave device according to claim 3, further comprising
an intermediate film that is located between the piezoelectric substrate and the second region, and is mainly composed of a metal having a lower density than Pt.

6. The acoustic wave device according to claim 1, wherein the second region has an amorphous structure.

7. The acoustic wave device according to claim 1, wherein a thickness of the first region in the stacking direction is greater than a thickness of the second region in the stacking direction.

8. The acoustic wave device according to claim 7, wherein the thickness of the second region in the stacking direction is equal to or greater than one-fifth of the thickness of the first region in the stacking direction.

9. The acoustic wave device according to claim 7, wherein the thickness of the second region in the stacking direction is equal to or greater than one-tenth of the thickness of the first region in the stacking direction.

10. The acoustic wave device according to claim 1, wherein
the metal film is mainly composed of at least one of Mo, Ir, Pt, Re, Rh, Ru, Ta, and W.

11. The acoustic wave device according to claim 1, wherein
the metal film is a Mo film.

12. A filter comprising:
an acoustic wave device including:
 a piezoelectric substrate, and
 a pair of comb-shaped electrodes that is located on the piezoelectric substrate, includes a metal film, and excites a surface acoustic wave, the metal film being mainly composed of a metal having a melting point equal to or higher than a melting point of Pt, the metal film having a first region in which a crystal grain has a columnar shape and a second region that is located on and/or under the first region in a stacking direction and has less crystallinity than the first region or has an amorphous structure.

13. A multiplexer comprising:
a filter including an acoustic wave device, wherein
the acoustic wave device includes:
 a piezoelectric substrate, and
 a pair of comb-shaped electrodes that is located on the piezoelectric substrate, includes a metal film, and excites a surface acoustic wave, the metal film being mainly composed of a metal having a melting point equal to or higher than a melting point of Pt, the metal film having a first region in which a crystal grain has a columnar shape and a second region that is located on and/or under the first region in a stacking direction and has less crystallinity than the first region or has an amorphous structure.

\* \* \* \* \*